United States Patent
Chen et al.

(10) Patent No.: US 11,621,214 B2
(45) Date of Patent: Apr. 4, 2023

(54) SEMICONDUCTOR PACKAGE AND METHOD FOR MANUFACTURING THE SAME

(71) Applicant: Taiwan Semiconductor Manufacturing Co., Ltd., Hsinchu (TW)

(72) Inventors: Hsien-Wei Chen, Hsinchu (TW); Jie Chen, New Taipei (TW); Ming-Fa Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 211 days.

(21) Appl. No.: 17/086,033

(22) Filed: Oct. 30, 2020

(65) Prior Publication Data

US 2021/0375721 A1    Dec. 2, 2021

Related U.S. Application Data

(60) Provisional application No. 63/030,568, filed on May 27, 2020.

(51) Int. Cl.
*H01L 29/40* (2006.01)
*H01L 23/48* (2006.01)
(Continued)

(52) U.S. Cl.
CPC ...... *H01L 23/481* (2013.01); *H01L 21/76898* (2013.01); *H01L 24/03* (2013.01);
(Continued)

(58) Field of Classification Search
CPC combination set(s) only.
See application file for complete search history.

(56) References Cited

U.S. PATENT DOCUMENTS

2004/0212086 A1\* 10/2004 Dotta ............... H01L 21/76898
257/E21.597
2009/0008790 A1\* 1/2009 Lee ......................... H01L 24/03
257/E23.145
(Continued)

FOREIGN PATENT DOCUMENTS

| JP | 2010245536 A | 10/2010 |
|---|---|---|
| KR | 20090002644 A | 1/2009 |
| KR | 20090010442 A | 1/2009 |

*Primary Examiner* — Niki H Nguyen
(74) *Attorney, Agent, or Firm* — Slater Matsil, LLP

(57) ABSTRACT

A semiconductor device includes a first passivation layer over a circuit and. conductive pad over the first passivation layer, wherein the conductive pad is electrically connected to the circuit. A second passivation layer is disposed over the conductive pad and the first passivation layer, and has a first opening and a second opening. The first opening exposes an upper surface of a layer that extends underneath the conductive pad, and the second opening exposes the conductive pad. A first insulating layer is disposed over the second passivation layer and filling the first and second openings. A through substrate via extends through the insulating layer, second passivation layer, passivation layer, and substrate. A side of the through substrate via and the second passivation layer have a gap that is filled with the first insulating layer. A conductive via extends through the first insulating layer and connecting to the conductive pad.

20 Claims, 23 Drawing Sheets

(51) Int. Cl.
*H01L 21/768* (2006.01)
*H01L 23/00* (2006.01)

(52) U.S. Cl.
CPC .............. *H01L 24/05* (2013.01); *H01L 24/08* (2013.01); *H01L 2224/02311* (2013.01); *H01L 2224/02372* (2013.01); *H01L 2224/02381* (2013.01); *H01L 2224/0557* (2013.01); *H01L 2224/05569* (2013.01); *H01L 2224/05647* (2013.01); *H01L 2224/08146* (2013.01)

(56) References Cited

U.S. PATENT DOCUMENTS

| | | | |
|---|---|---|---|
| 2009/0026614 A1 | 1/2009 | Jung | |
| 2009/0160061 A1* | 6/2009 | Hsu | H01L 23/481 |
| | | | 257/E23.161 |
| 2010/0252935 A1 | 10/2010 | Lee et al. | |
| 2011/0069264 A1* | 3/2011 | Huang | G03F 7/0007 |
| | | | 349/122 |

* cited by examiner

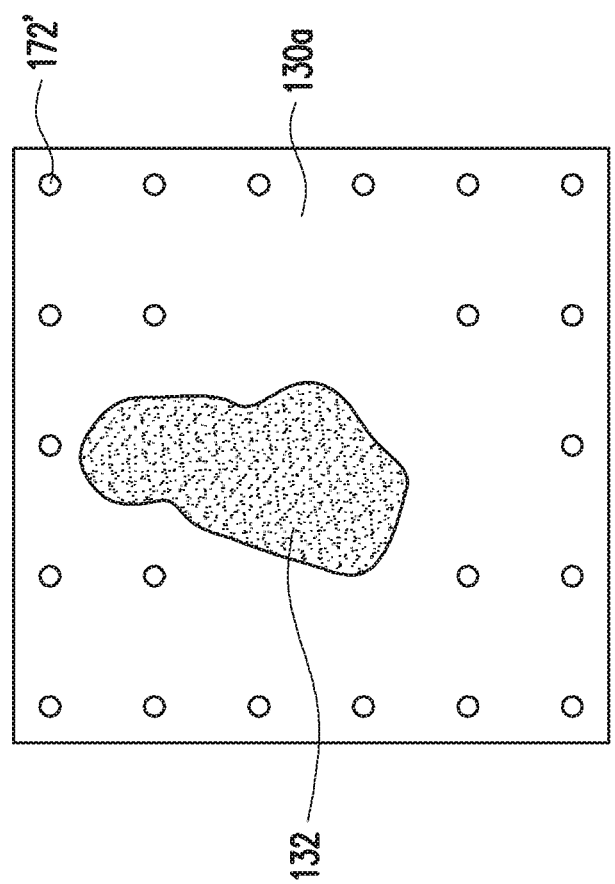

SEMICONDUCTOR PACKAGE AND METHOD FOR MANUFACTURING THE SAME

PRIORITY CLAIM AND CROSS-REFERENCE

This application claims priority to U.S. Provisional Patent Application No. 63/030,568, filed May 27, 2020, entitled "Front Side Post TSV Formation for Multi-Layer Stacking," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies further advance, stacked semiconductor devices, e.g., 3D integrated circuit (3DIC) packages, have emerged as an effective alternative to further reduce the physical size of a semiconductor device. In a stacked semiconductor device, active circuits such as logic, memory, processor circuits, and the like are manufactured on different semiconductor wafers. Two or more semiconductor components may be installed on top of one another to further reduce the form factor of the semiconductor device.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor device. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1K are schematic cross-sectional views showing various stages in a manufacturing method of a semiconductor device according to some exemplary embodiments of the present disclosure.

FIG. 5B is a schematic top view showing a stage in a manufacturing method of a semiconductor device according to some exemplary embodiments of the present disclosure.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
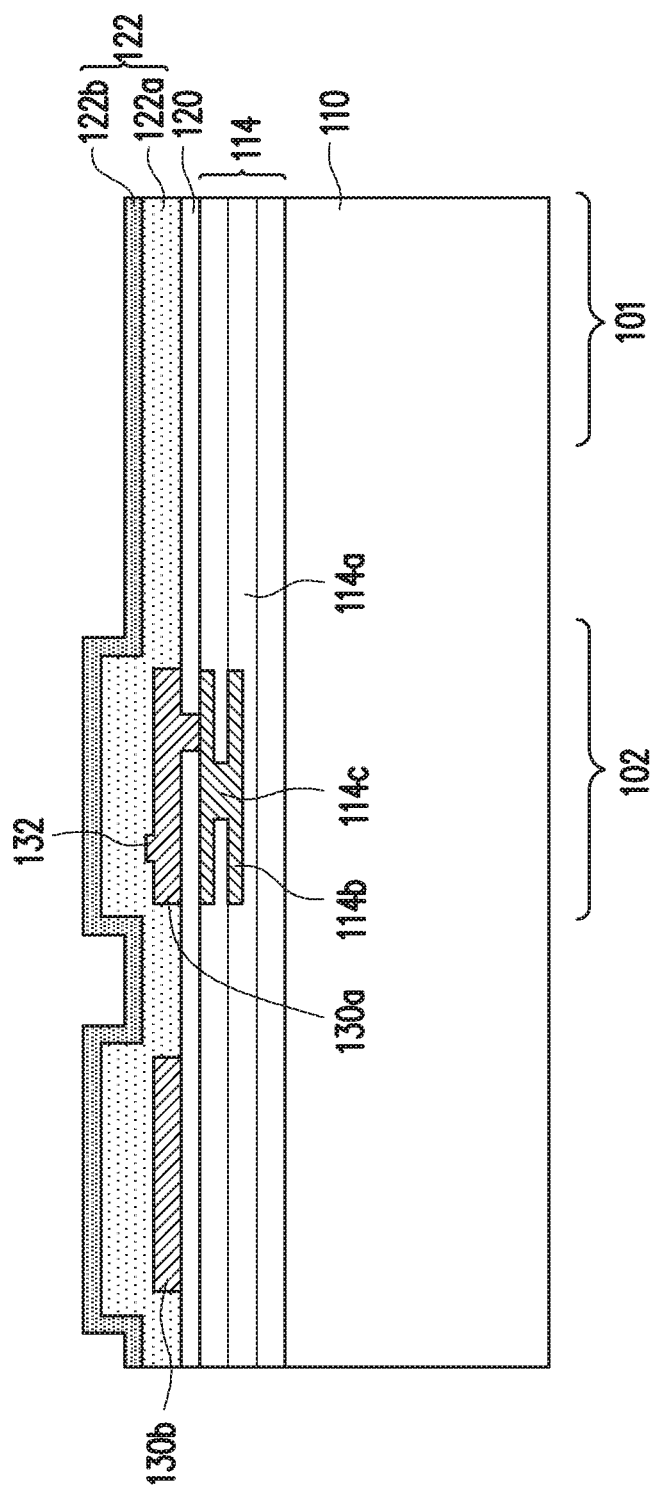

FIG. 1A illustrates a semiconductor device 100 in an intermediate stage of manufacture. The semiconductor device 100 may be a semiconductor wafer or a semiconductor die separated from a semiconductor wafer. The semiconductor device 100 includes a semiconductor substrate 110, such as silicon, doped or undoped, or an active layer of a semiconductor-on-insulator (SOI) substrate. The semiconductor substrate 110 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Active and/or passive devices, such as transistors, diodes, capacitors, resistors, etc., may be formed in and/or on the semiconductor substrate 110.

In some embodiments, the semiconductor substrate has a first region 101 and a second region 102. Different features can be formed in the first region 101 and the second region 102. For example, a through conductive via may be formed in the first region 101. No active or passivation device is formed in the first region 101, or at least in the regions where the conductive via will be formed, with the exception that in some embodiments, it may be desired for the conductive via to electrically contact a portion of an interconnect structure, as will be described below. The active and passive devices may be formed in the second region 102 and other regions of the semiconductor substrate 110. Although only one region 102 and one region 101 are illustrated for clarity, those skilled in the art will recognize that multiple such regions can be formed on a typical integrated circuit, with different configurations. For instance, in some embodiments, regions 101 could be dispersed amongst multiple regions 102, whereas in other embodiments, a single region 101 or array of regions 101 could be formed about the periphery of a region 102.

In an embodiment, the semiconductor device 100 includes an interconnection structure 114 over the semiconductor substrate 110. The interconnection structure 114 may include metallization features in one or more dielectric layers 114a. The metallization features may include metal lines 114b distributing in the dielectric layers and vias 114b that connect the metal lines 114b at different levels. The metallization features may include copper, tungsten, cobalt, ruthenium, their alloys, or a combination thereof. In some embodiments, the metal lines 114a and vias 114b may further include a diffusion barrier layer. The diffusion barrier layer may include titanium, titanium nitride, tantalum, tantalum nitride, or a combination thereof. In some embodiments, the interconnect structure 114 may be formed by one or more single damascene processes, one or more dual damascene processes, or a combination thereof.

In some embodiments, dielectric layers 114a have at least one layer formed of silicon oxide or a low-k dielectric material. The low-k dielectric material has a dielectric constant (k-values) lower than 3.9. In some embodiments, the dielectric constant of the low-k dielectric material is lower about 3.0 or lower than about 2.7. For example, the low-k dielectric material may be formed of Black Diamond (a registered trademark of Applied Materials), a carbon-containing low-k material, a porous low-k material, hydrogen silsesquioxane (HSQ) or methyl silsesquioxane (MSQ).

The semiconductor device 100 includes a passivation layer 120 formed over the interconnection structure 114. The passivation layer 120 may be formed of silicon nitride, silicon oxynitride, silicon carbon nitride, a polymer, other materials, or combinations thereof, able to prevent the underlying interconnection structure 114 from the adverse effects of detrimental chemicals and moistures. In an embodiment, the passivation layer 120 has a thickness of about 0.3 µm to about 2.5 µm. The passivation layer 120 may be formed by chemical vapor deposition (CVD), plasma-enhanced CVD (PECVD), or other suitable processes. In some embodiments, the passivation 120 layer has a flat upper surface.

A conductive pad 130a, alternatively referred to as a testing pad, is formed over the first passivation layer 120 in the second region 102. The conductive pad 130a may be formed of aluminum or its alloys, such as aluminum-copper alloys. The conductive pad 130a may have a diameter of about 2 µm up to about 500 µm, or alternatively be rectangular (or another polygon) in shape with sides ranging in the same dimensions. Conductive lines connected to the conductive pad are typically in the range of from about 1.5 µm to about 30 µm in diameter or width. In some embodiments, the conductive pad 130a includes a probe mark 132. The probe mark 132 may be formed after being contacted by testing equipment, for example, a tip or a needle of a probe card, which scratches, gouges, or otherwise impacts the surface of the conductive pad. The probe mark 132 can be a structure that includes a center portion depressed from the upper surface of the conductive pad 130a and a ring portion that protrudes over the upper surface of the conductive pad 130a and surrounds the center portion. The probe mark 132 may have any shape, such as a circle, a square, a rectangle, an ellipse or other possible shapes. The probe mark 132 can have a diameter typically in a range of from about 10 µm to about 300 µm, although this is by way of example and not be way of limitation, typically located at or near the center of the conductive pad 130a. In the illustrated embodiment, the probe mark 132 is off-center of conductive pad 130a, resulting from either design or mis-alignment. In some embodiments, the probe mark 132 partially occupies the upper surface of the conductive pad 130a and leaves suitable space for a via that will land on the conductive pad 130a.

In some embodiments, a conductive line 130b is formed at the same level as the conductive pad 130a and connects to the conductive pad 130a. The conductive pad 130a and the conductive line 130b may be formed of the same material and formed together in the same patterning process. In an embodiment, a conductive via 134 is formed under the conductive pad 130a or conductive line 130b for electrically connecting the interconnection structure 114 to the conductive pad 130a or the conductive line 130b.

A passivation film 122 is formed over the passivation layer 120 and covers the conductive pad 130a. The passivation layer 122 may include one or more layers. For example, the passivation layer 122 may be a bi-layered structure including a layer 122a and a layer 122b. The layer 122a may be formed of silicon nitride, silicon oxynitride, or other suitable materials. The layer 122b may be formed of silicon oxide, boron-doped silicon glass (BSG), or phosphorus-doped silicon glass (PSG), other similar materials, or combinations thereof. The layer 122a can have a thickness of about 0.3 µm to about 1.5 µm. The layer 122b may have a thickness of about 0.6 µm to about 3 µm, typically. The layer 122b can provide a buffer to conductive pad 130a by alleviating the stress generated from the layer 122a. In some embodiments, the passivation layer 122 is formed by a deposition process, such as CVD, PECVD, and has an upper surface conformal to the profile of conductive pad 130a.

Figure 1B:
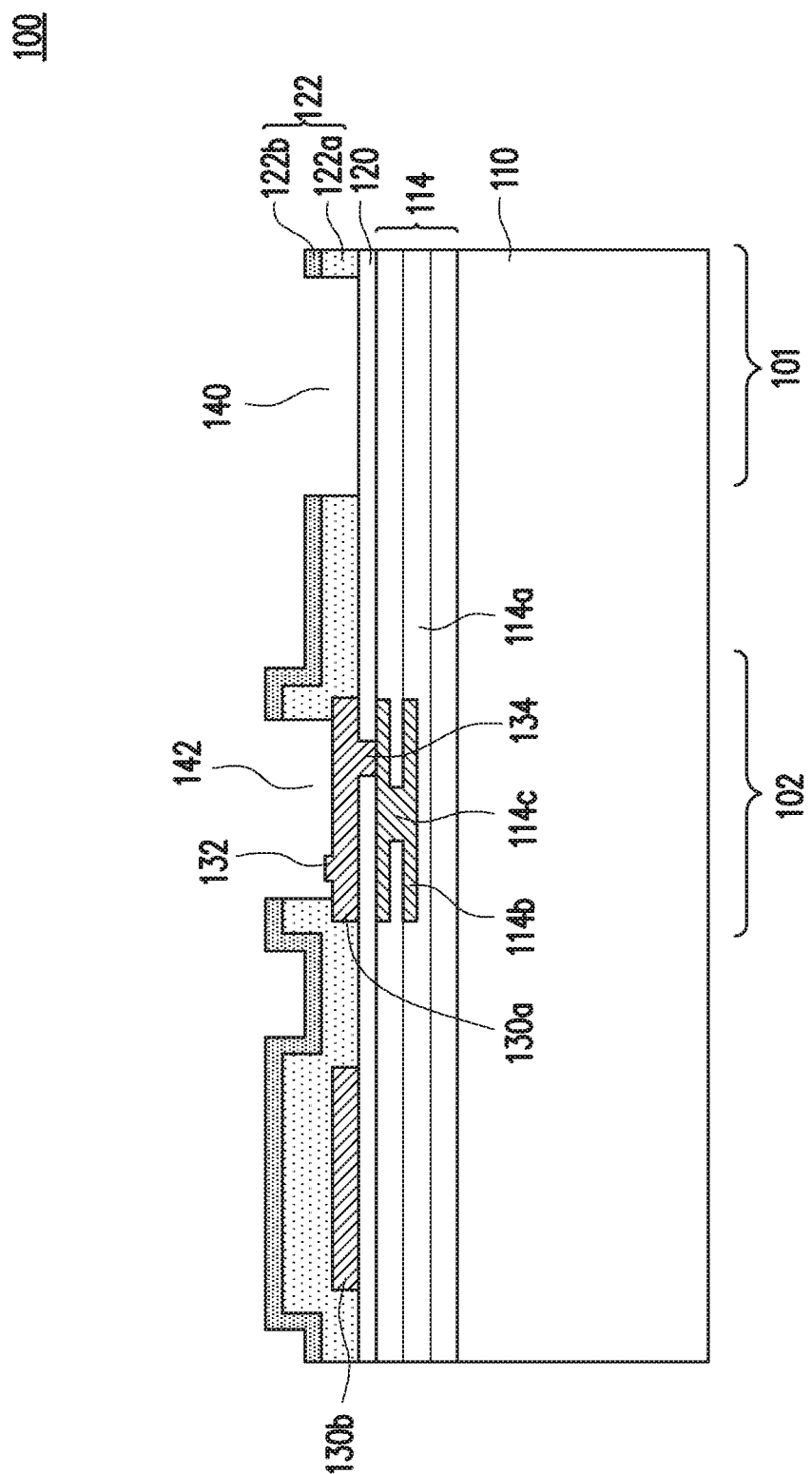

As illustrated in FIG. 1B, an opening 140 is formed in the passivation layer 122 in the first region 101. The opening 140 exposes the first passivation layer 120. The opening 140 may have a diameter of about 1 µm to about 200 µm. An opening 142 is formed in the passivation layer 122 in the second region 102. The opening 142 exposes the conductive pad 130a and the probe mark 132. The opening 142 may have a diameter of around about 2 µm to about 500 µm, for example. In some embodiments, the opening 142 is aligned with the center of the conductive pad 130a without exposing the sidewall of the conductive pad 130a. In other embodiments, the opening 142 is partially aligned with the conductive pad and exposes a sidewall of the conductive pad 130a (not shown in figures). In an embodiment, the opening 140 and the opening 142 are formed in the same patterning process. While only a single opening 140 and a single opening 142 are illustrated, it should be appreciated that multiple opening 140 and 142 in different sizes, patterns, and configurations are within the contemplated scope of the present disclosure. The patterning process may include forming a photoresist layer (not shown) over the passivation layer 122; patterning the photoresist layer to form patterns of the openings 140 and 142 in the photoresist layer by lithography, and etching the passivation layer 122 according to the patterns in the photoresist layer with using conductive pad 130a and the first passivation layer 120 as the etch stop. The scope of this disclosure is not limited to lithographic patterning, and other patterning techniques such as ion-beam, e-beam, and the like, are within the contemplated scope.

Figure 1C:
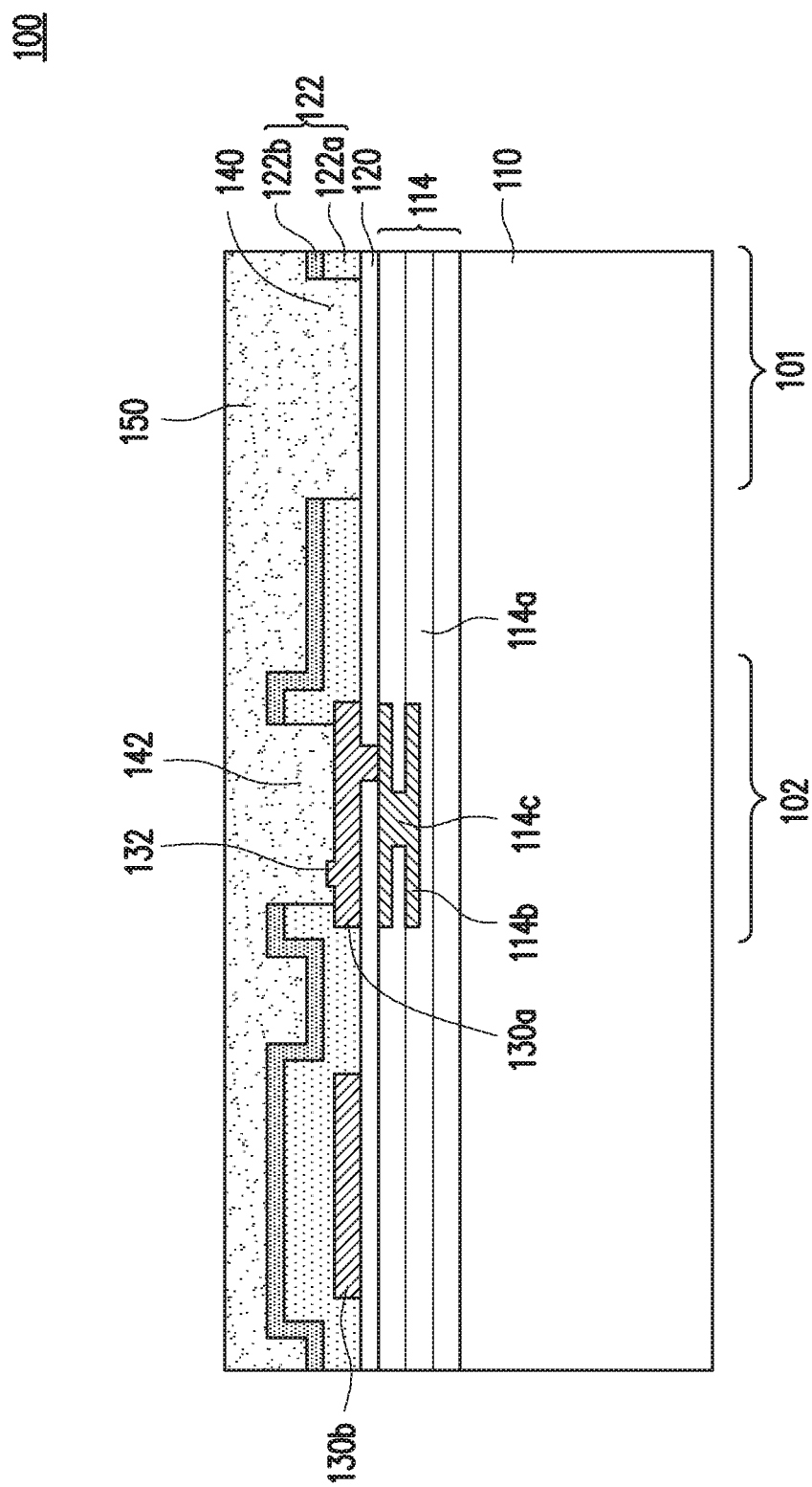

As illustrated in FIG. 1C, an insulating layer 150 is formed over the passivation layer 122. In some embodiments, the insulating layer 150 fills the openings 140 and 142. The insulating layer 150 may have a flat upper surface for facilitating subsequent conductive layers formed thereon. For example, the insulating layer 150 may be formed by depositing a film over the passivation layer 122 and performing a planarization process, such as chemical mechanical polishing (CMP), an etch-back process, or mechanical grinding, on the film. In yet other embodiments, insulating layer 150 could be deposited using a technique that provides a sufficient planar surface to avoid the need for a planarization step. The insulating layer 150 may include silicon oxide or other similar materials. In some embodiments, the function or electrical properties of the semiconductor device 100 is tested by connecting testing equipment (e.g., probing card) to the conductive pad 130a before forming the insulating layer 150. The formation of the insulating layer 150 and subsequent processes proceed only if the semiconductor device 100 passes the function or electrical test.

Figure 1D:
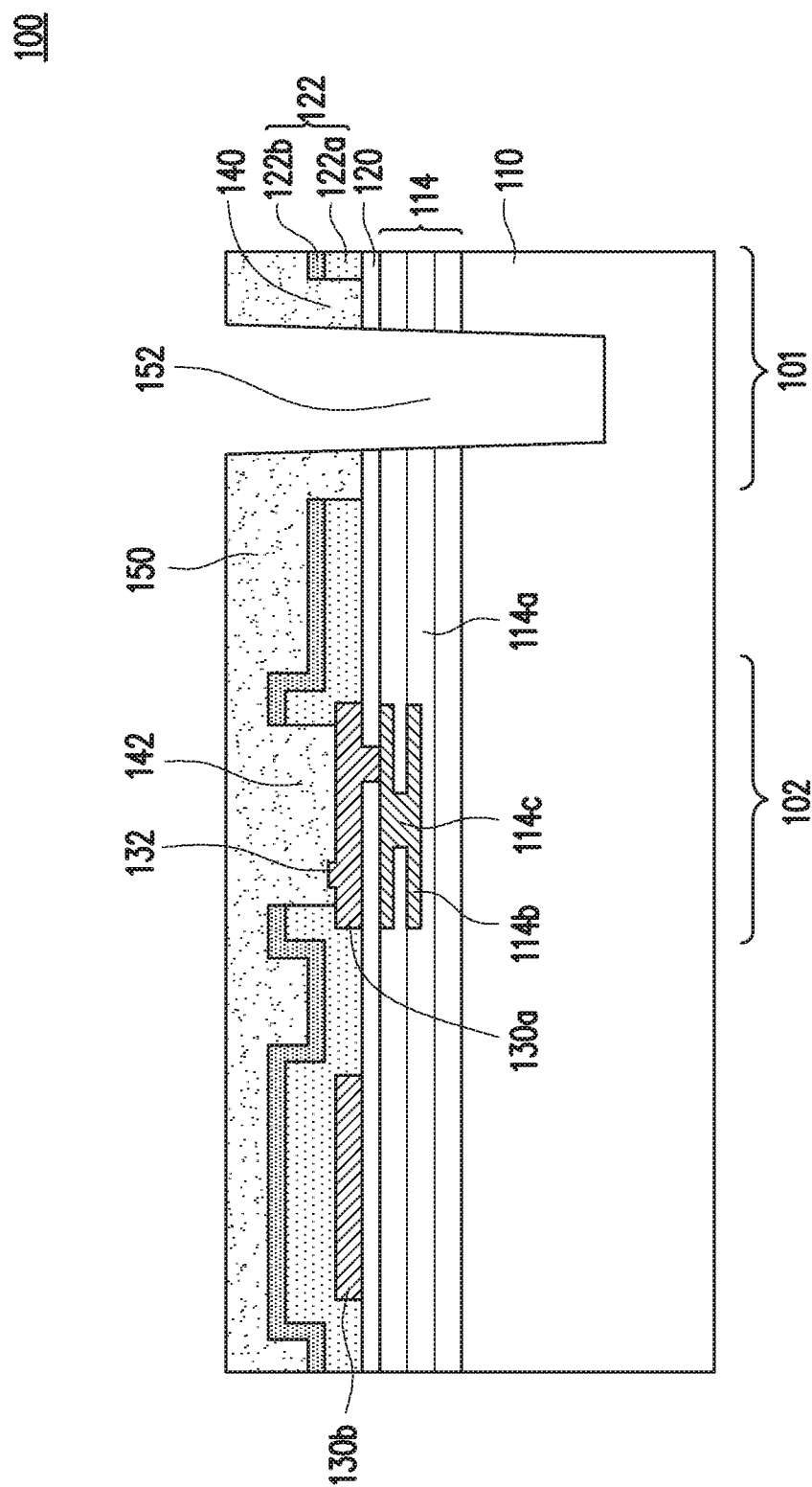

As illustrated in FIG. 1D, a via hole 152 is formed in the first region 101 by etching the insulating layer 150, the passivation layer 120, the dielectric layers 114a and the semiconductor substrate 110. In some embodiments, the via hole 152 extends from the insulating layer 150, through passivation layer 120 and the dielectric layers 114a, and into the semiconductor substrate 110. The via hole 152 is at least partially aligned with the first opening 140. The via hole 152 may have a diameter that is appropriate for the application. As a general rule, the via hole 152 should be in the range of about 0.5 times to about 0.9 times the diameter of opening 140. In some embodiments, the via hole 152 has a size smaller than the first opening 140. In other embodiments, the via hole 152 has a size larger than the first opening 140 (not shown in figures). Via hole 152 is shown aligned with a portion of interconnection 114 wherein no lines 114b or vias 114c are formed. In other embodiments, however, via hole 152 could be positioned so that subsequently formed conductive via 154 (FIG. 1E) can electrically connect to one or more lines 114b within interconnection structure 114.

Figure 1E:
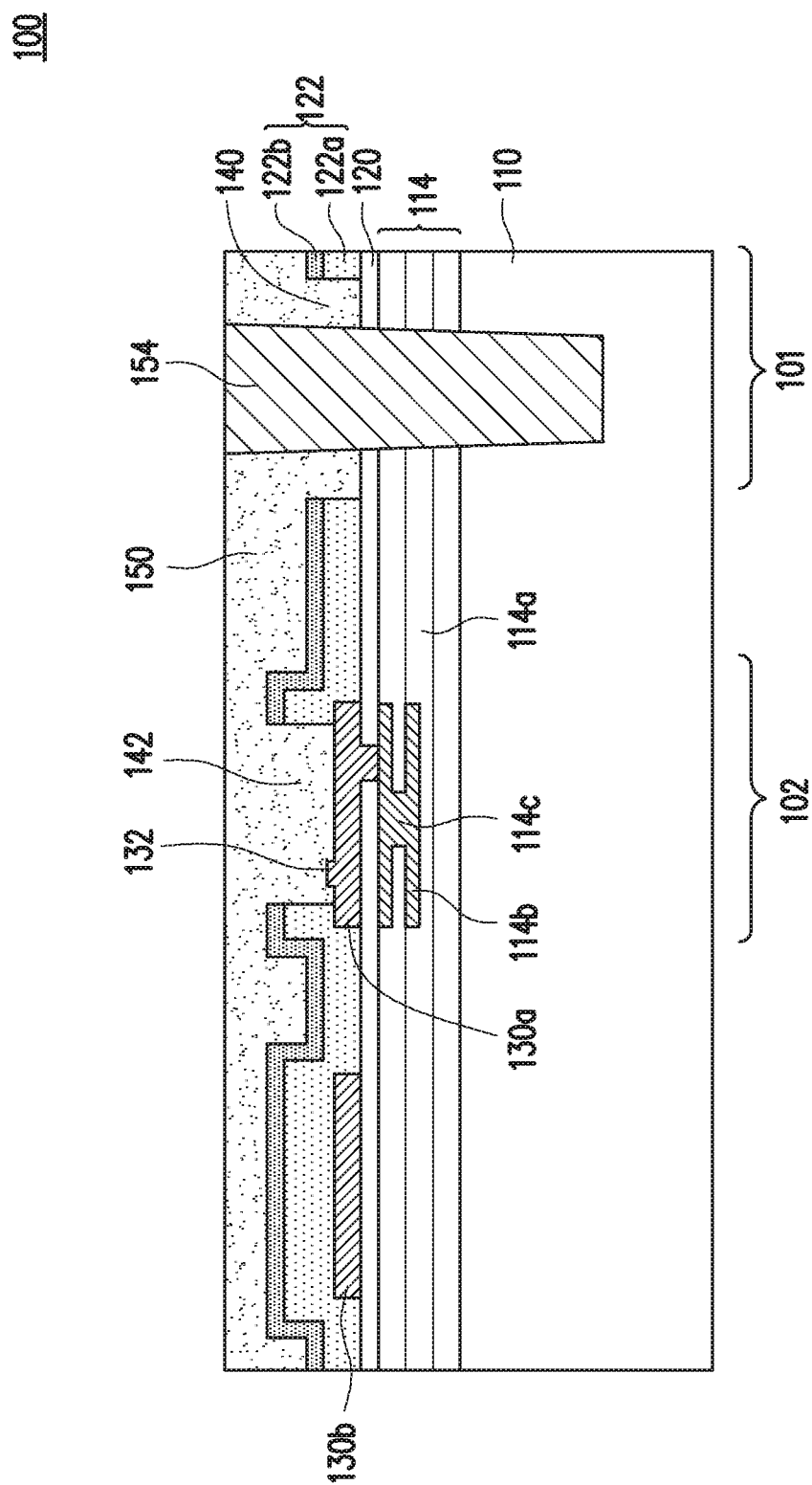

As illustrated in FIG. 1E, a conductive material is filled with the via hole 152 to form a conductive via 154. The conductive via 154 may be horizontally spaced apart from the passivation layer 122 but in contact with the passivation layer 120. The gap between a side of the conductive via 154 and the passivation layer 122 is filled with the insulating layer 150. The conductive material may include copper, aluminum, silver, gold, platinum, palladium, tungsten, and alloys thereof. The conductive via 154 may be formed by, e.g., forming a seed layer over the insulating layer 150 and in the openings via hole 152, plating (e.g., electroplating or electroless plating) the conductive material over the seed layer, and then removing the conductive material overfilling the via hole 152 by a planarization process such as CMP. In some embodiments, the seed layer may include a sub-layer of copper and a sub-layer of a barrier layer (e.g., titanium, titanium nitride, tantalum, tantalum nitride, or a combination thereof). Other methods for forming the conductive via 154 are possible and are fully intended to be included within the scope of the present disclosure. Likewise, one skilled in the art will recognize the forming conductive via 154 could include the formation of one or more dielectric liners, barrier liners, adhesion layers, and the like.

Figure 1F:
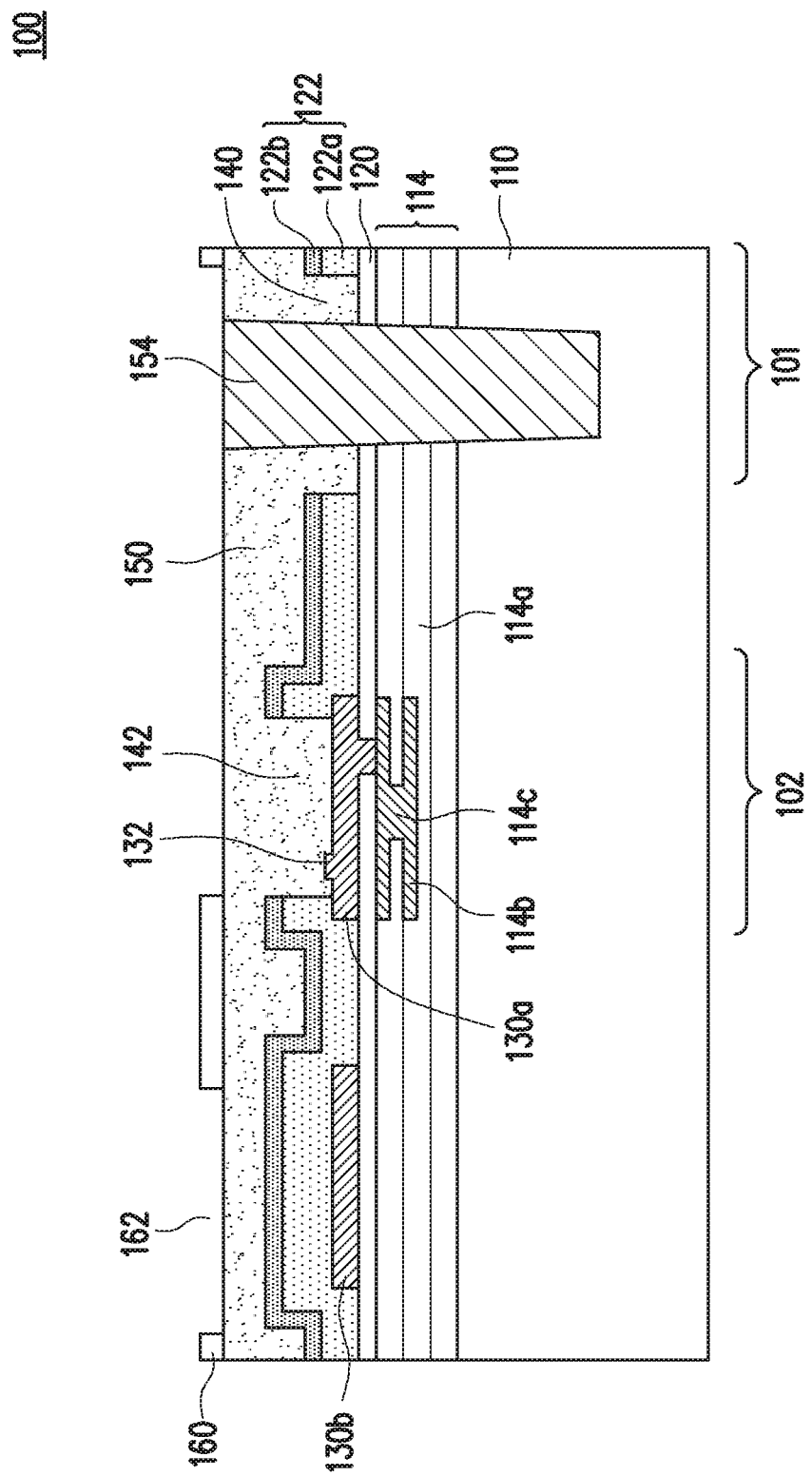

As illustrated in FIG. 1F, an insulating layer 160 is formed over the insulating layer 150 and the conductive via 154. The insulating layer 160 is patterned to have a line trench 162. The line trench 162 may expose at least a portion of the conductive via 154. The line trench 162 may have a portion aligned with the conductive pad 130a. In an embodiment, the insulating layer 160 is formed of a material same as from that of insulating layer 150 although a material different from that of the insulating layer 150 can be used. For example, the insulating layer 160 may include silicon oxide or undoped or doped silicon glass. In other embodiments, the insulating layer 162 may include silicon nitride, silicon oxynitride, silicon carbide, or other suitable materials.

Figure 1G:
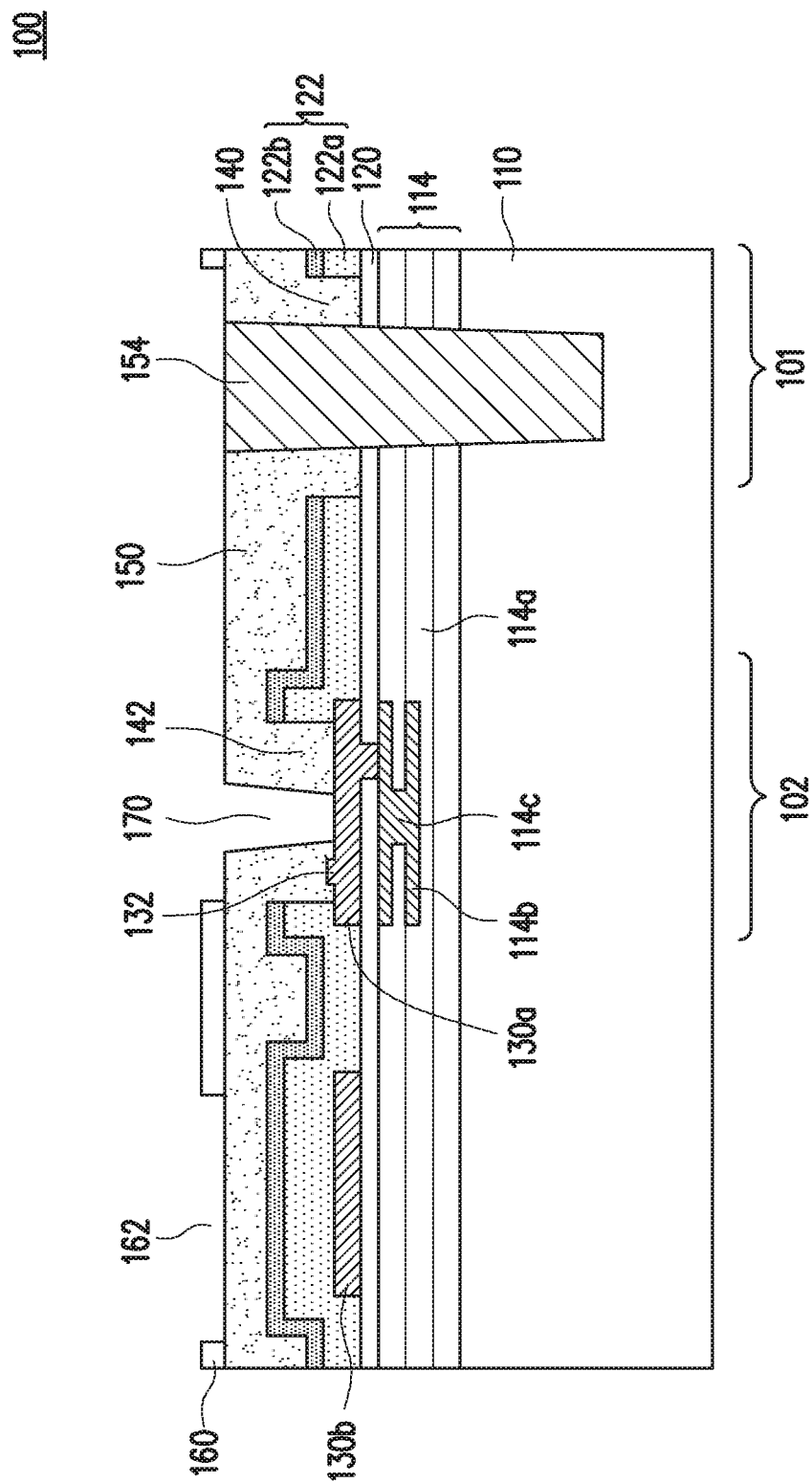

As illustrated in FIG. 1G, a via hole 170 is formed in the second region 102 by etching the insulating layer 150. The formation process of the via hole 170 includes forming a photoresist layer that has a pattern for the via hole over the insulating layers 150 and 160 and etching the insulating layer 150 according to the pattern of the photoresist layer. In some embodiments, when the pattern of the photoresist layer exposes a portion of the insulating layer 160, the insulating layer 160 can act as a mask together with the photoresist layer when etching the insulating layer 150. The via hole 170 is at least partially aligned with the conductive pad 130a. In one embodiment, the via hole 170 fully lands on the upper surface of the conductive pad 130a. In other embodiments, the via hole 170 exposes at least a portion of the sidewall of the conductive pad 130a. In some embodiments, the via hole 170 is spaced apart from the probe mark 132 and at least partially aligned with the line trench 162.

Figure 1H:
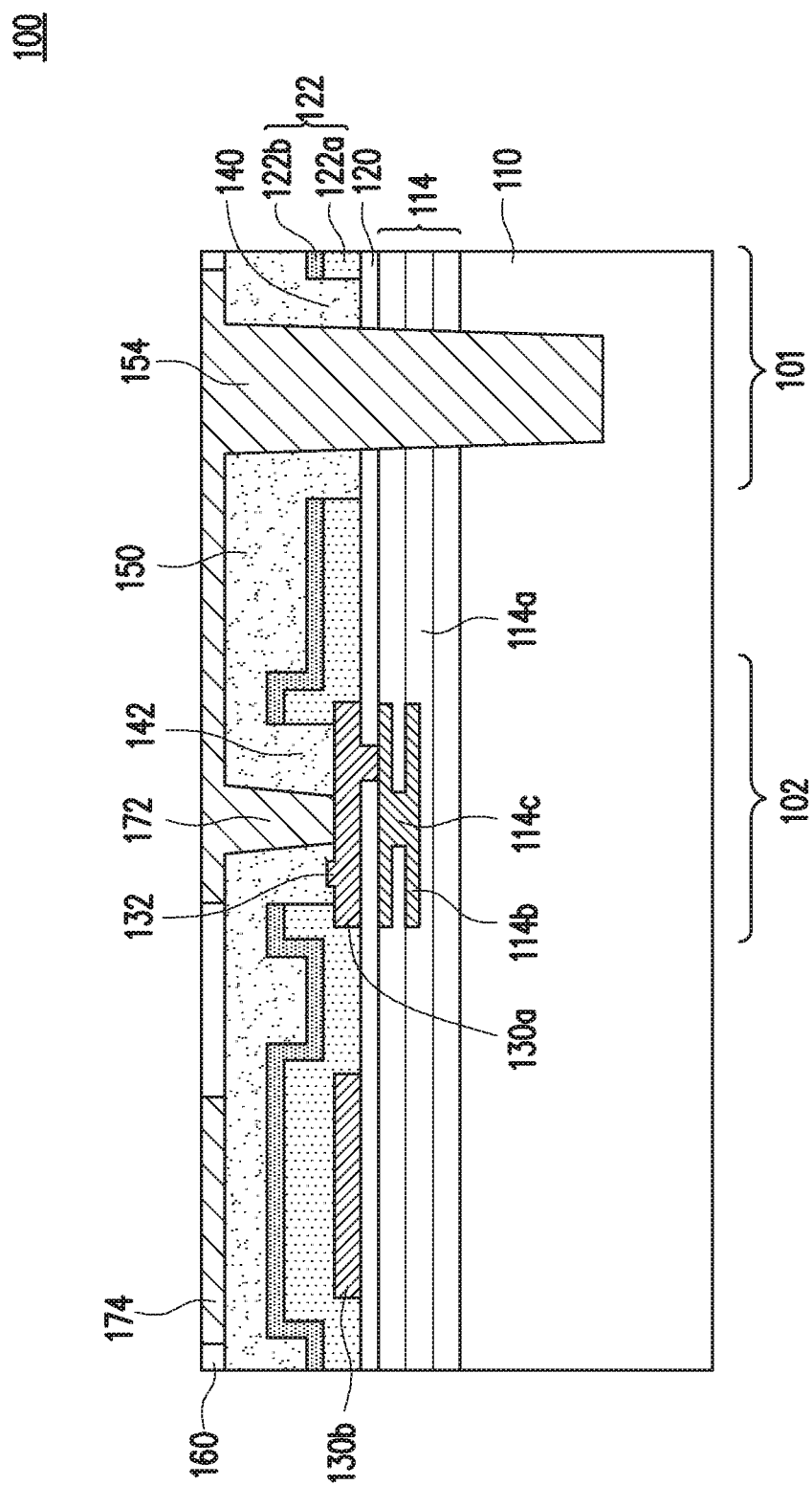
Figure 11:
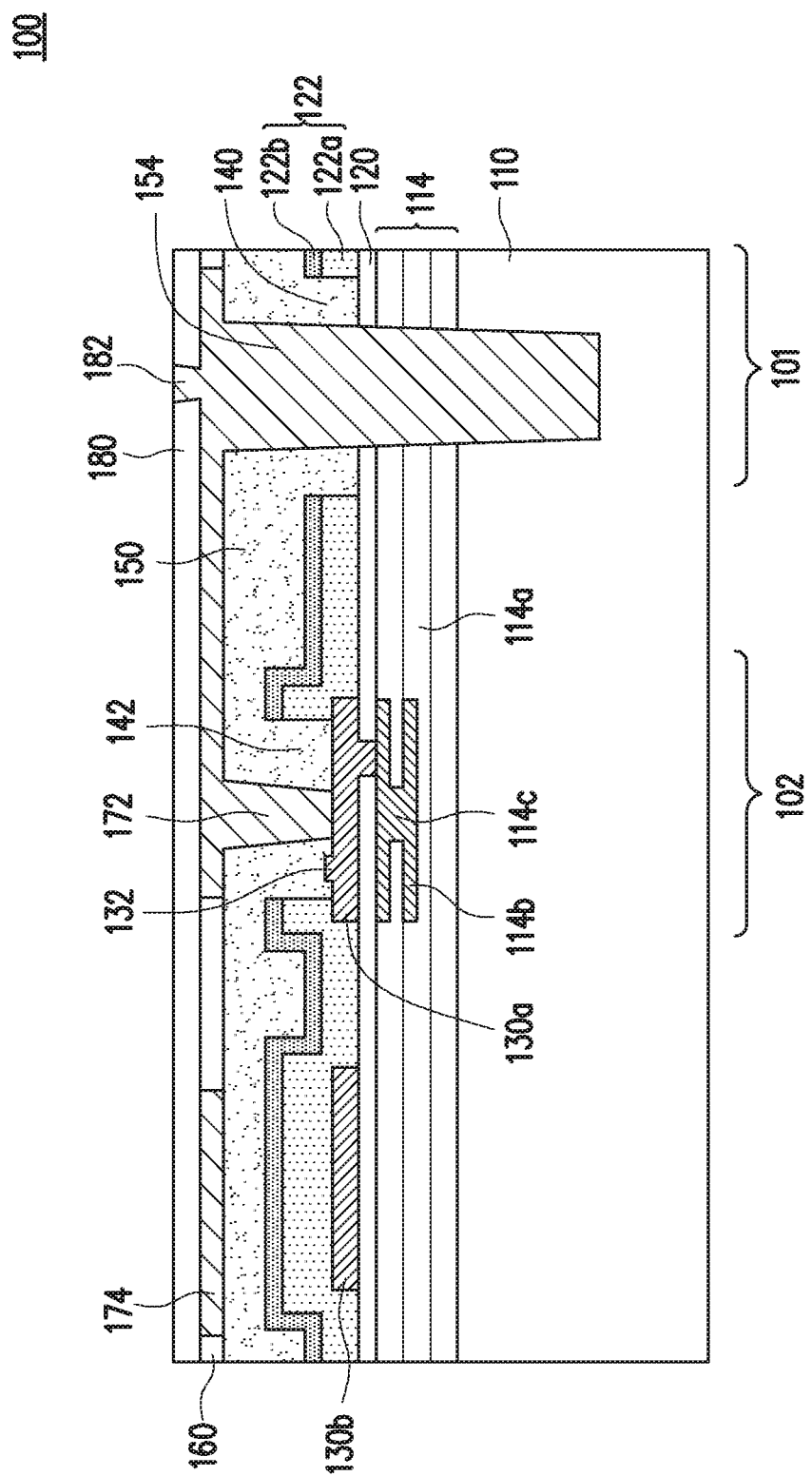

As illustrated in FIG. 1H, a conductive material is deposited to fill the via hole 170 and the line trench 162 to form a conductive via 172 and conductive lines 174. The conductive via 172 connects to the conductive pad 130a and one of the conductive lines 174 at its ends in FIG. 1H. In other embodiments, conductive pad 130a and conductive via 154 could be electrically isolated from one another, or connected to one another through interconnection structure 114, for example. The conductive material may be, but is not necessarily, the same material as used to form conductive via 154. The filling process may be formed by, e.g., forming a seed layer in the via hole 170 and the line trench 162, plating (e.g., electroplating or electroless plating) the conductive material over the seed layer, and then removing the conductive material overfilling the line trench 162 by a planarization process such as CMP. In some embodiments, the seed layer may include a sub-layer of copper and a sub-layer of a barrier layer (e.g., titanium, titanium nitride, tantalum, or tantalum nitride). Other methods for forming the conductive via 172 and the conductive lines 174 are possible and are fully intended to be included within the scope of the present disclosure.

As illustrated in FIG. 1I, in some embodiments, an insulating layer 180 and a bonding pad 182 are formed over the insulating layer 160 and the conductive lines 174. The insulating layer 180 may include silicon oxide, silicon oxynitride, silicon nitride, or combinations thereof. In an embodiment, the bonding pad 182 connects to the conductive via 174. The bonding pad 182 includes copper or other suitable metals or conductors, or alloys thereof. The bonding pad 182 may be formed by a damascene process. In some embodiments that the semiconductor device 100 illustrated in FIG. 1A is in a wafer form, and a dicing process is performed to separate the semiconductor device 100 into die form. Alternatively, wafer scale integration is within the contemplated scope of this disclosure and device 100 (or the other devices illustrated herein) could encompass an entire wafer.

Figure 1J:
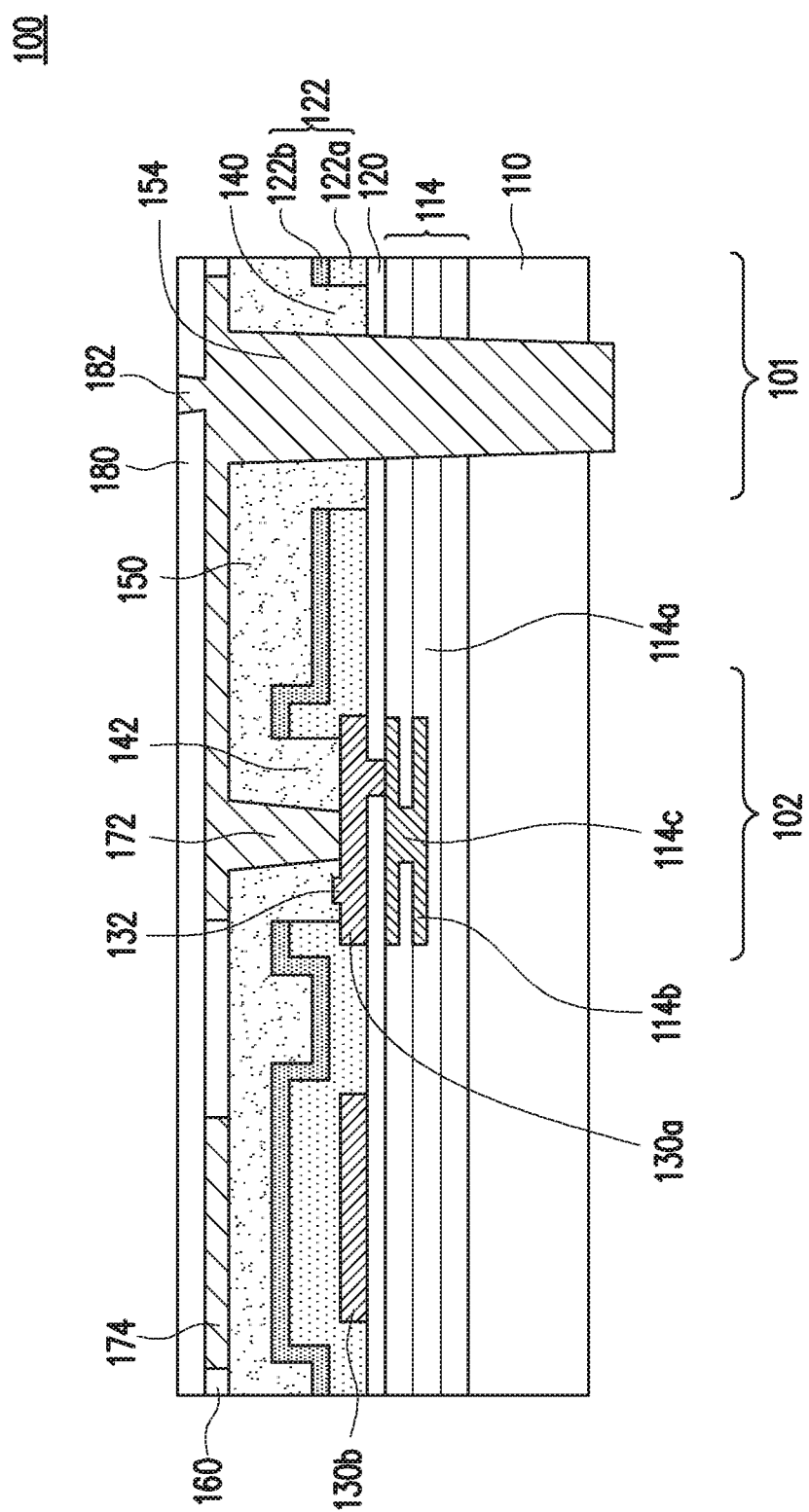
Figure 1K:
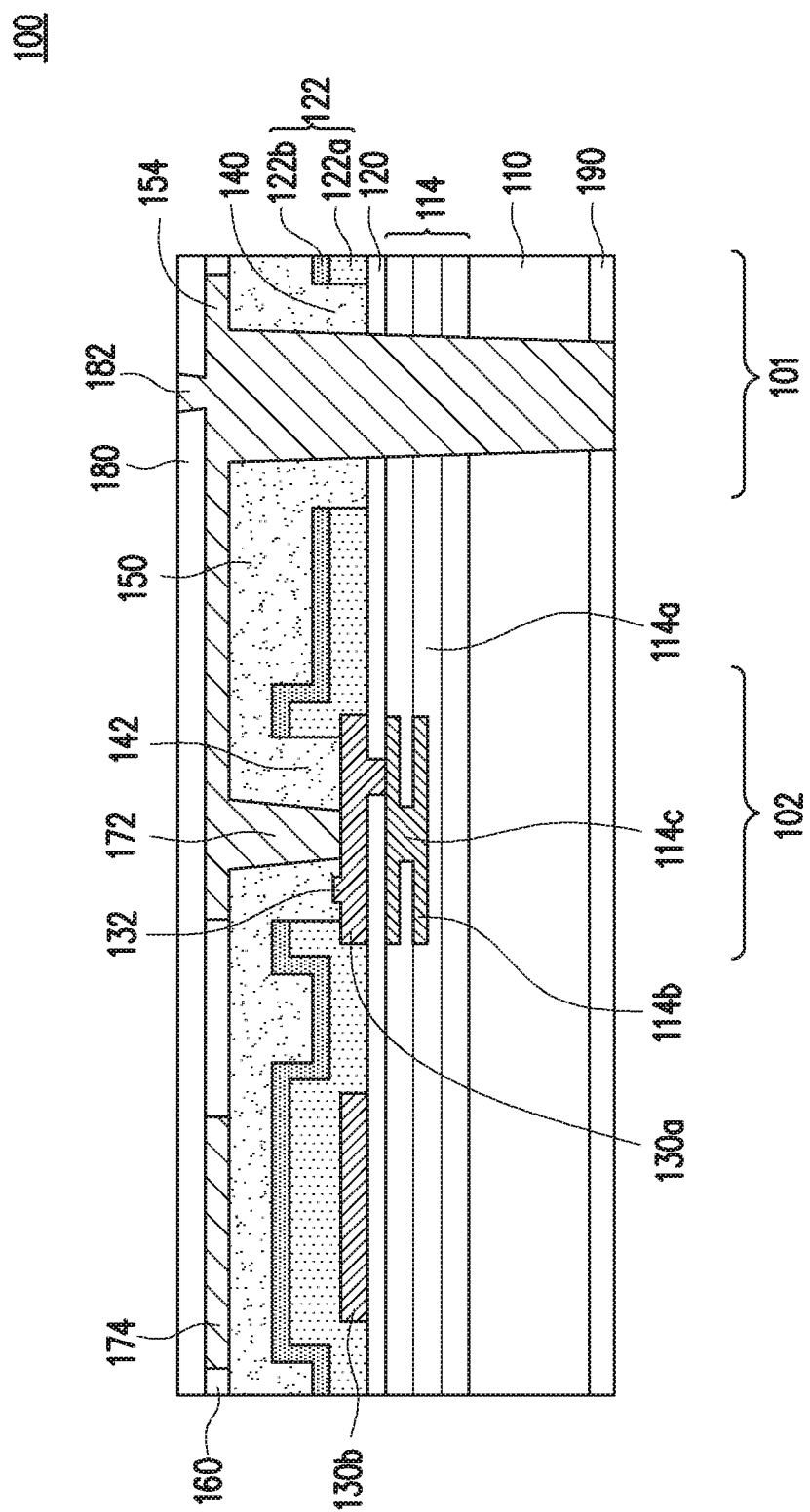

As illustrated in FIG. 1J, a portion of the semiconductor substrate 110 is removed from the backside of the semiconductor substrate 110 (the side opposite to the interconnection structure 114) to reveal a portion of the conductive via 174. The conductive via 174 thus becomes a through substrate via (TSV). The semiconductor substrate 110 may be removed by a grinding process. As illustrated in FIG. 1K, an oxide layer 190 (e.g., silicon oxide) is formed over the backside surface of the semiconductor substrate 110. In some embodiments, the oxide layer 190 may be formed by an oxidation process, such as thermal oxidation, chemical oxidation, or a combination thereof.

In the above embodiments, the passivation layers 120 and 122 include hard materials, such as silicon nitride or silicon oxynitride, which are relatively difficult to etch compared to other insulating/dielectric layers. For instance, it would difficult to control the etch rates and the etching profiles in etching multiple layers of varied properties. By forming the opening 140 together with the opening 142, which is formed for the testing purpose, the etching process for forming the via hole 172 would be easier to control because only one passivation layer 122 needs to be etched.

Figure 2A:
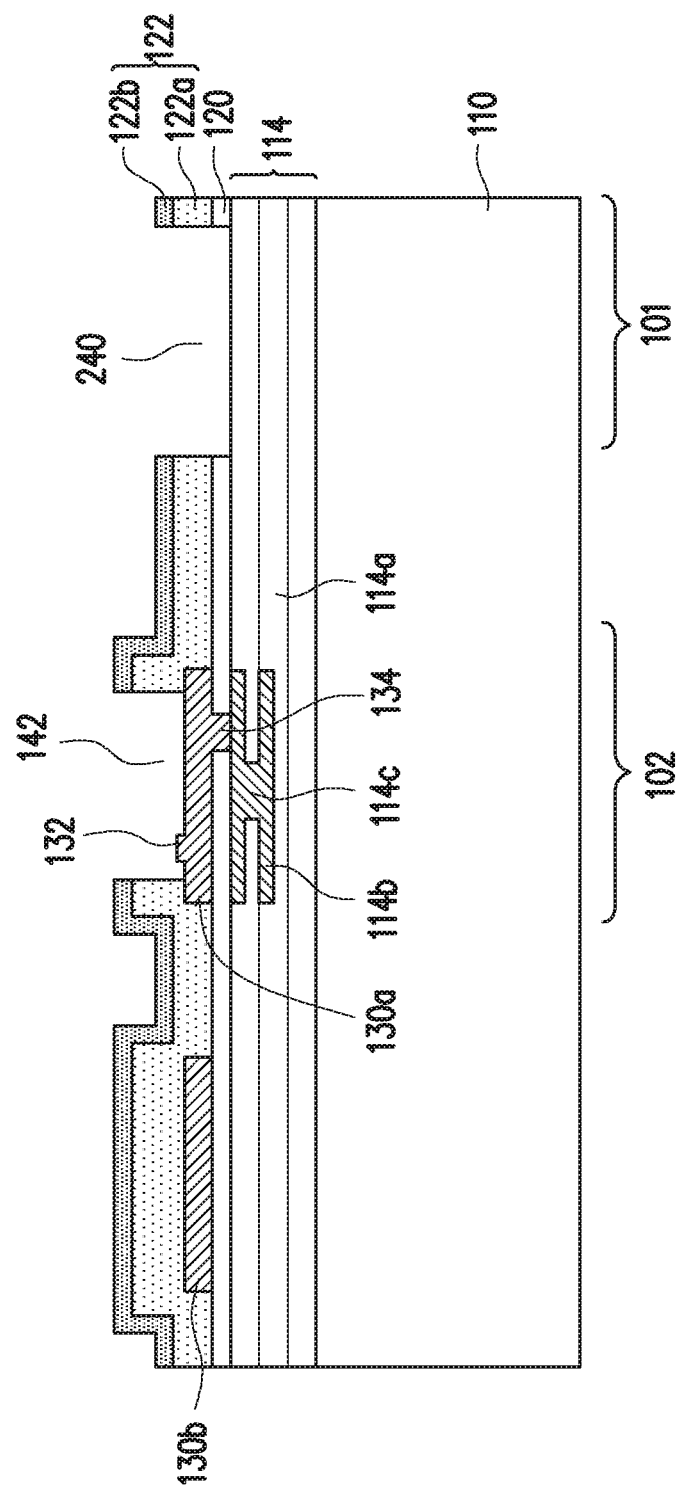
FIGS. 2A through 2B are schematic cross-sectional views showing various stages in a manufacturing method of a semiconductor device according to some exemplary embodiments of the present disclosure.
Figure 2B:
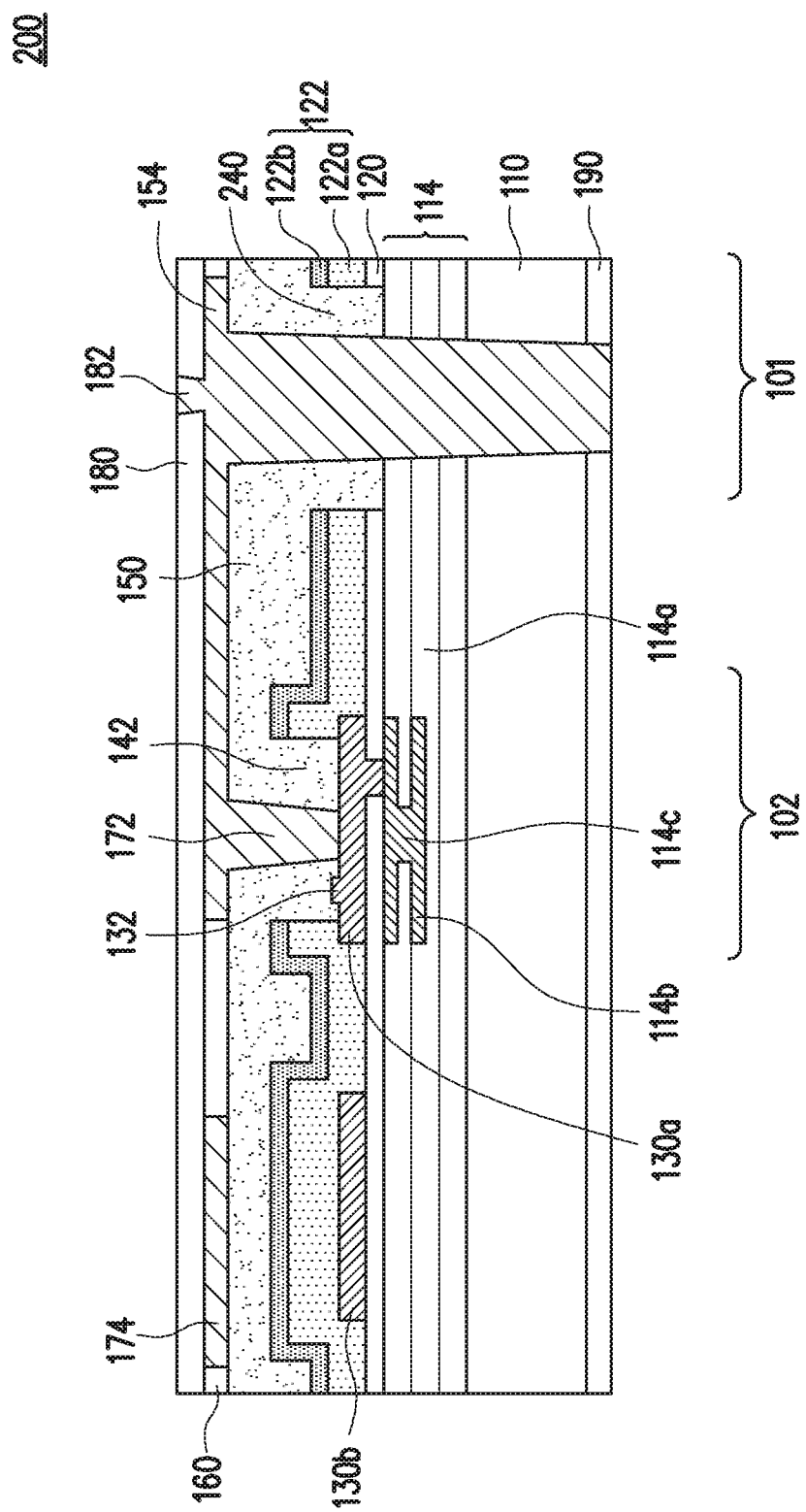

FIGS. 2A-2B illustrate intermediate stages of manufacturing a semiconductor device 200 according to some embodiments of the present disclosure. The semiconductor device 200 in FIG. 2A is the same as the semiconductor device 100 illustrated in FIG. 1A except an opening 240 is formed in the passivation layer 122 and the passivation layer 120 in the first region 101. The opening 240 exposes the underlying dielectric layer 114a. In an embodiment, the opening 240 is formed in the same etching process of forming the opening 142 using the dielectric layer 114a as an etching stop. Likewise, conductive pad 130a can be used as an etching stop in opening 142.

In other embodiments, the opening 240 is formed by performing another etching process to etch the passivation layer 120 after the openings 140 and 142 are formed in the semiconductor device 100 illustrated in FIG. 1A. For example, the process of forming the opening 240 may include forming a photoresist layer having a pattern at least partially overlapping the opening 140; performing an etching process to remove a portion of passivation layer 120 according to the pattern of the photoresist layer and the profile of the opening 140; and removing the photoresist layer.

After the opening 240 is formed, similar manufacturing steps illustrated in FIGS. 1B-1K proceed, and the resulting semiconductor device 200 is illustrated in FIG. 2B. In an embodiment, the insulating layer 150 fills the opening 240 and is in contact with the dielectric layer 114a of the interconnection structure 114. In the above embodiments, when performing the etching process for forming the via hole 172, the etching process does not need to penetrate the passivation layer 120, which helps the etching process easier to be controlled.

Figure 3A:
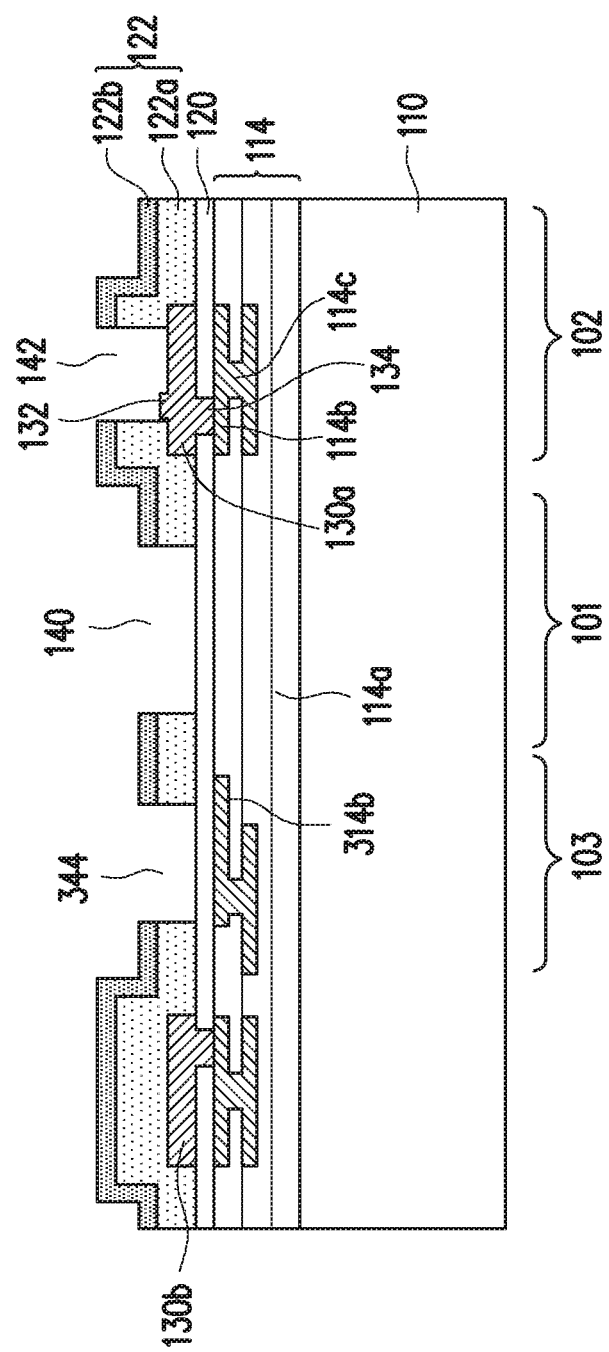
FIGS. 3A through 3B are schematic cross-sectional views showing various stages in a manufacturing method of a semiconductor device according to some exemplary embodiments of the present disclosure.
Figure 3B:
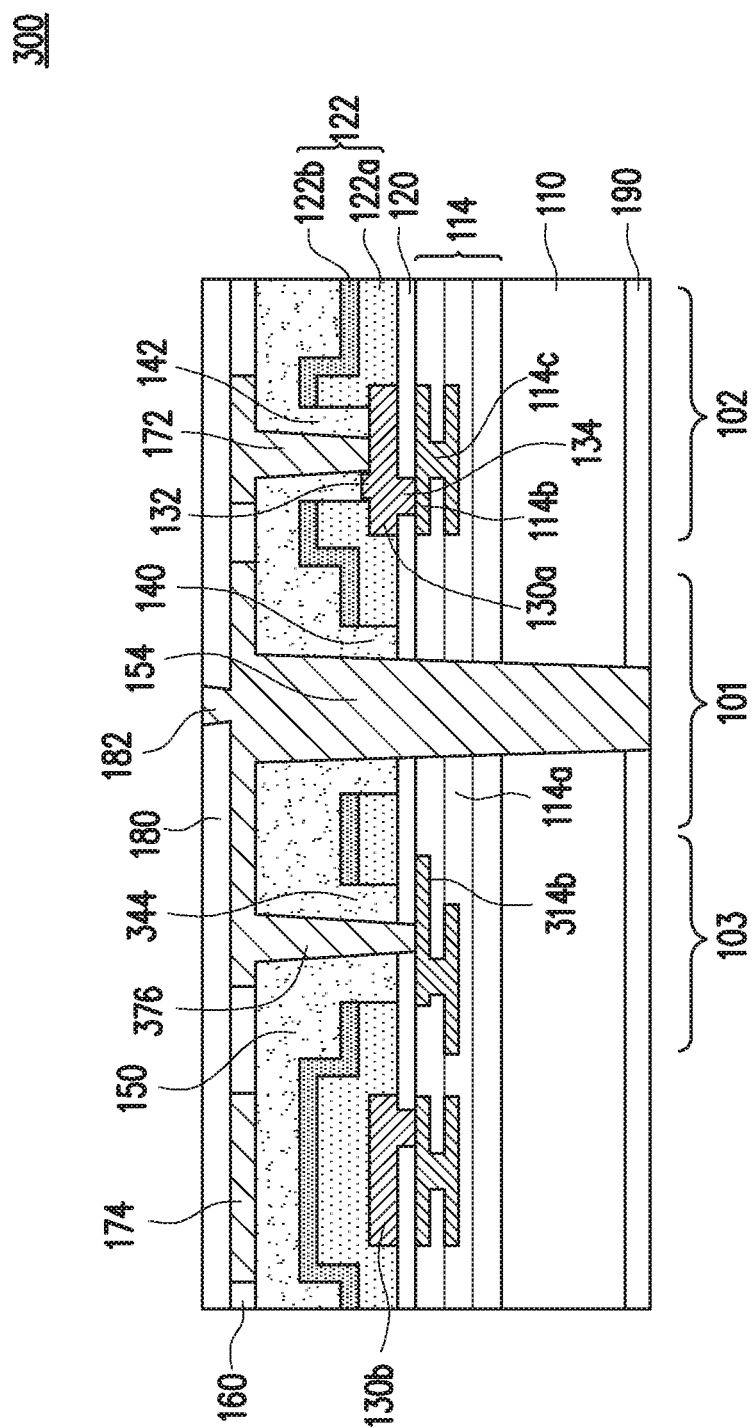

FIGS. 3A-3B illustrate intermediate stages of manufacturing a semiconductor device 300 according to some embodiments of the present disclosure. The semiconductor device 300 at this stage is the same as the semiconductor device 100 illustrated in FIG. 1A except the semiconductor device 300 has a third region 103. Metallization features of the interconnection structure 114 are formed in the third region 103 without a testing pad 130a disposed of thereon. The metallization features of the interconnection structure 114 may include a landing pad 314b located at the top level of the interconnection structure 114. An opening 344 is formed in the passivation layer 122 and expose the passivation layer 120 because the passivation layer 120 is not covered by the conductive pad 130a. In an embodiment, the opening 344 is formed together with the openings 140 and 142 in the same etching process.

After the opening 344 is formed, similar manufacturing steps illustrated in FIGS. 1B-1K proceed, and the resulting semiconductor device 300 is illustrated in FIG. 3B. The manufacturing steps further include forming a conductive via 376 in the insulating layer 150 in the third region 103. The conductive via 376 extends from the insulating layer 150, passing through the passivation layer 120, and lands on the landing pad of 314b of the interconnection structure 114. The conductive via 376 may, but not necessarily, also connect to the conductive line 174.

Figure 4A:
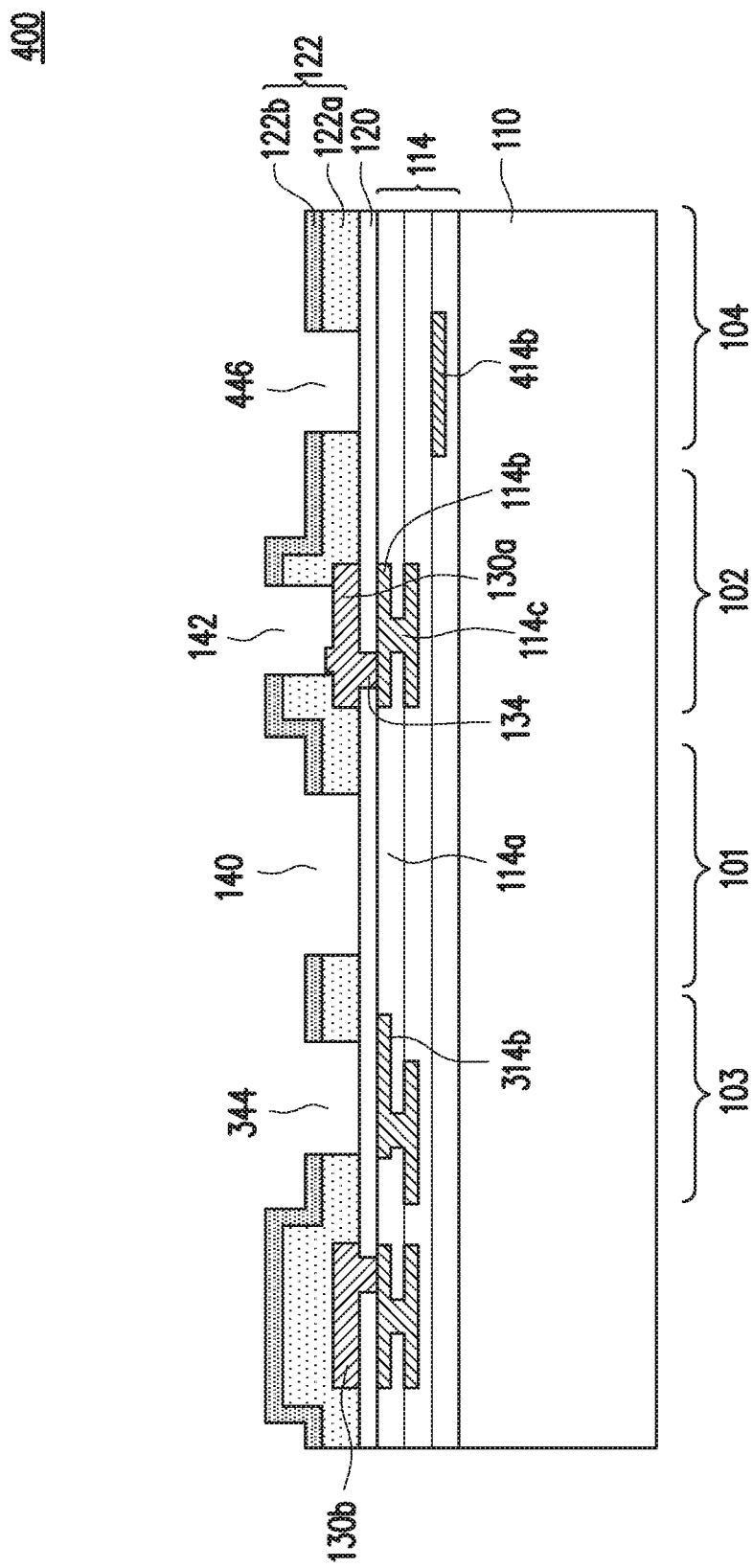
FIGS. 4A through 4B are schematic cross-sectional views showing various stages in a manufacturing method of a semiconductor device according to some exemplary embodiments of the present disclosure.

In some embodiments, the landing pad is not necessarily formed on the top level of the dielectric layers. For example, FIG. 4A illustrates a landing pad 414b locating at a middle or lower level of the dielectric layer 114a in a fourth region 104. In an embodiment, landing pads can be formed at different levels of the dielectric layers of the interconnection structure, and conductive vias land on the landing pads at different levels. For example, FIG. 4A illustrates a landing pad 314b locating at the upper level of the dielectric layers 114a in the third region 103 and a landing pad 414a locating at a lower level of the dielectric layers 114a in the fourth region 104. In some embodiments, an opening 446 is formed in the passivation layer 122 and exposes the passivation layer 120. The opening 446 may be formed together with the openings 140, 142, and 344 in the same etching process. In other embodiments, the opening 446 is formed by an additional etching process after the openings 140 and 142 are formed at the semiconductor device 100 illustrated in FIG. 1A.

Figure 4B:
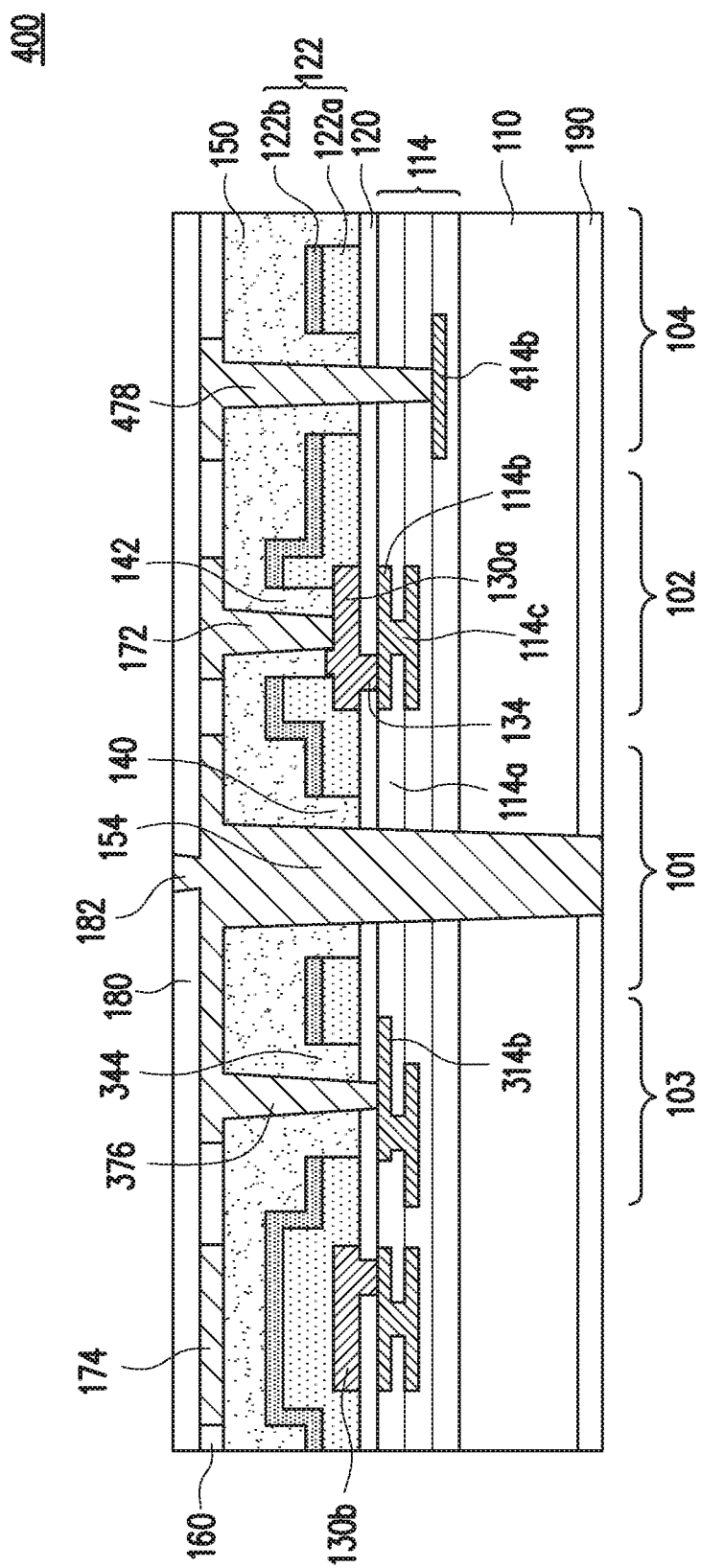

After the opening 446 is formed, similar manufacturing steps illustrated in FIGS. 1B-1K proceed, and the resulting semiconductor device 400 is illustrated in FIG. 4B. A conductive via 478 is formed in the fourth region 104. In some embodiments, the conductive via 478 extends through the insulating layer 150, passing through the passivation layer 120 and the upper level of the dielectric layers 114a to physically connect the landing pad 414b that is located at the lower level of the dielectric layers 114a. In some embodiments, conductive vias land on the landing pads at different levels of the dielectric layers in different regions. For example, a conductive via 376 lands on the landing pad 314b located at the top level of the dielectric layers 114a in the third region 103, and a conductive via 478 lands on the landing pad 414b located at the lower level of the dielectric layers 114a in the fourth region 104.

It should be noted that the embodiments of FIG. 3A-3B and 4A-4B both use a process wherein a first opening is formed that penetrates passivation layer 122 and stops on or exposes passivation layer 120 before insulating layer 150 is formed—as contrasted with the process disclosed in FIG. 2A wherein the first opening penetrates through passivation layers 122 and 120 prior to forming insulating layer 150. It is within the contemplated scope of this disclosure that the structures described with reference to FIGS. 3A-3B and 4A-4B could be formed using the process described with regard to FIG. 2A, in which case insulating layer 150 would likewise contact interconnection structure 114 in the finished product.

Figure 5A:
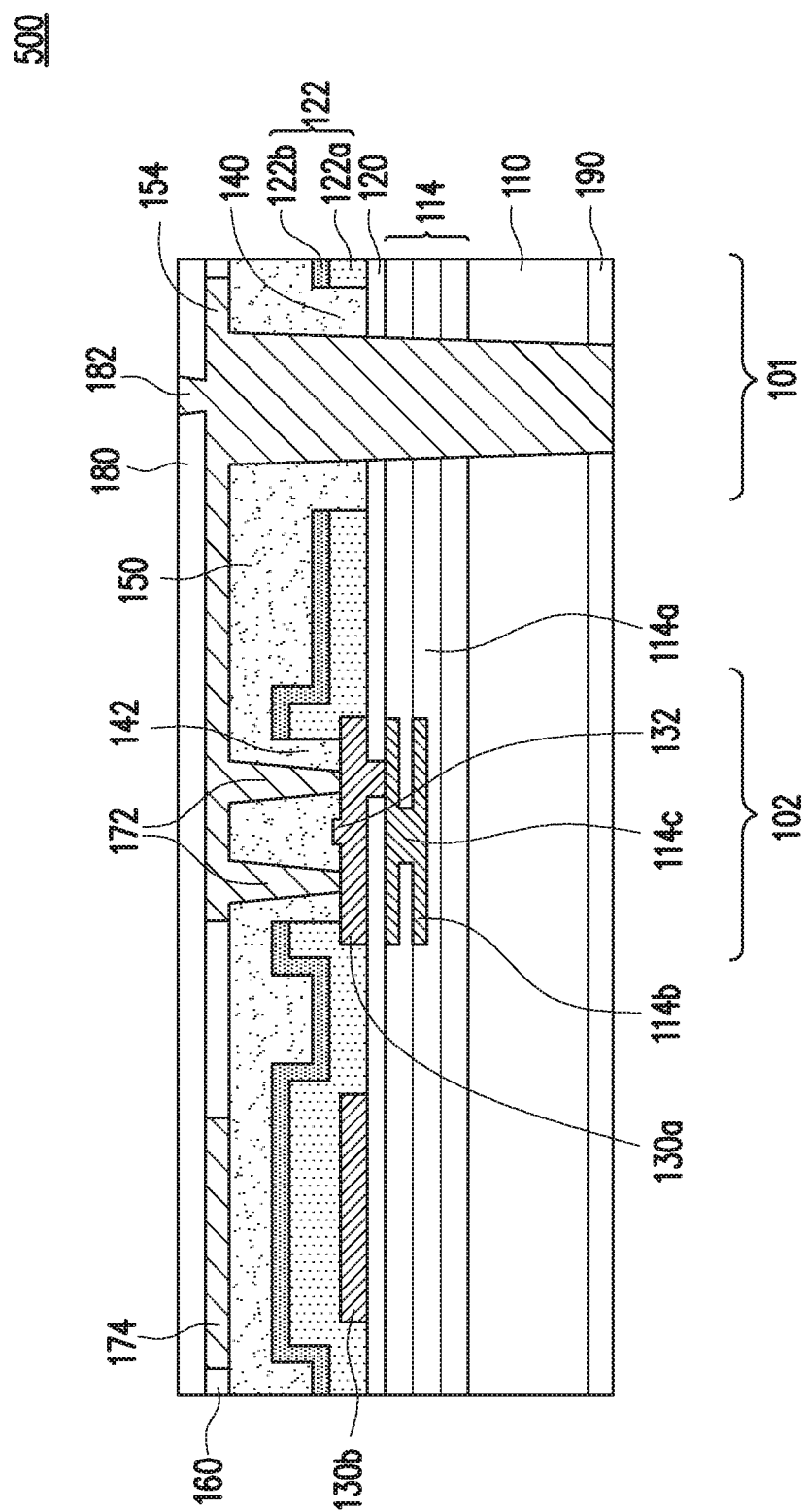
FIG. 5A is a schematic cross-sectional view showing a stage in a manufacturing method of a semiconductor device according to some exemplary embodiments of the present disclosure.

FIG. 5A illustrates an intermediate stage of manufacturing a semiconductor device 500 according to some embodiments of the present disclosure. The semiconductor device 500 in FIG. 5A is the same as the semiconductor device 100 illustrated in FIG. 1K except a plurality of conductive vias 172' are formed around the probe mark 132. For example, FIG. 5B shows a top view at the conductive pad portion 130a of the semiconductor device 500. The probe mark 132 is formed at or near the center of the conductive pad 130a, and a plurality of conductive vias 172' at the peripheral portion of the conductive 130a and surrounds the probe mark 132. In some embodiments, the conductive via 172' may have a diameter smaller than that of the conductive via 172. At least one of the conductive vias 172' may be laterally spaced apart from the probe mark 132 in accordance with some embodiments. The conductive vias 172' may be formed by the similar processes with the processes of forming the conductive via 172, but with different lithography patterns. It should be noted that the conductive vias 172' can be also used in the semiconductor devices 100, 200, 300, or 400 as illustrated in FIG. 1K, 2B, 3B, or 4B.

Figure 6:
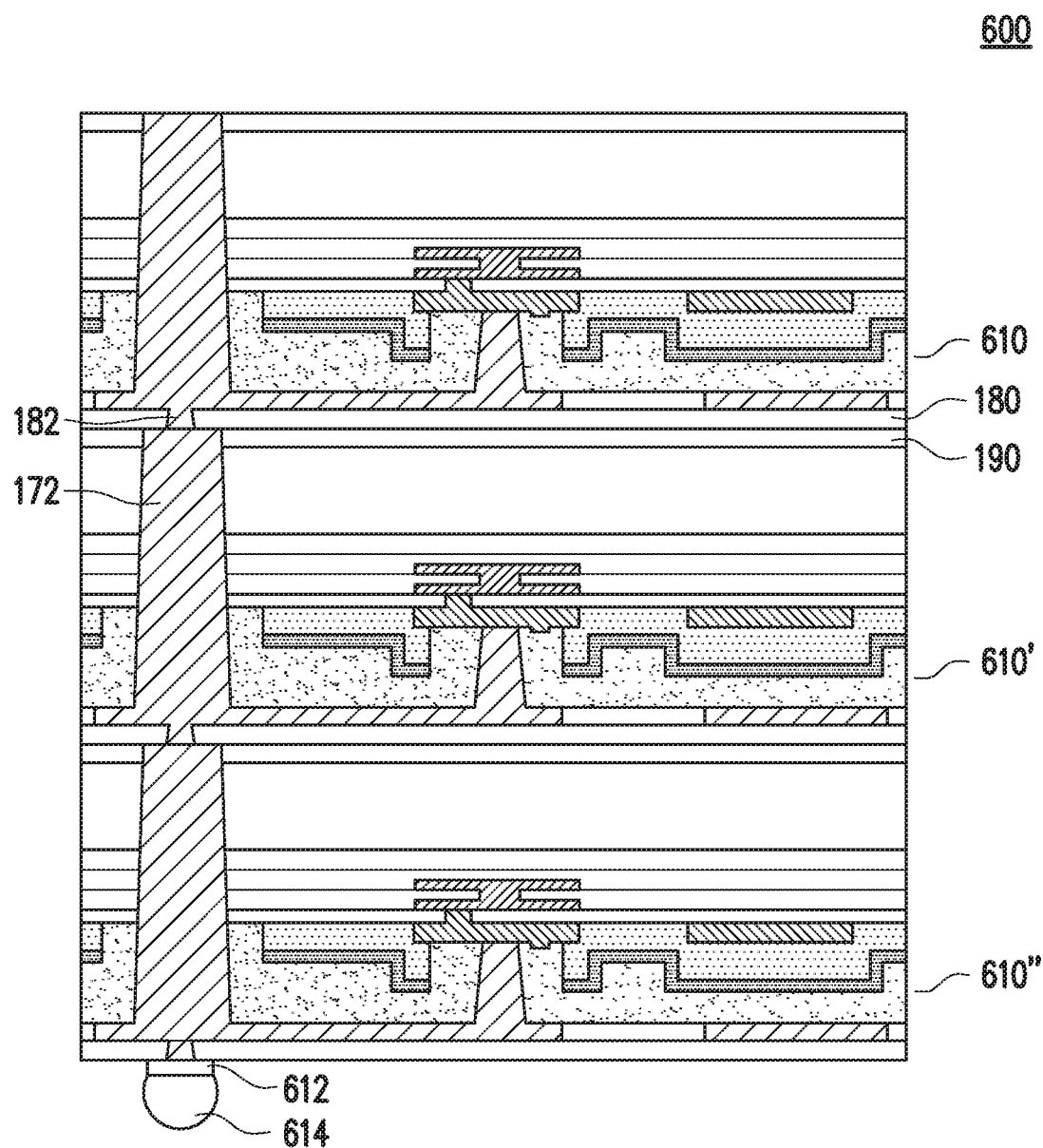
FIG. 6 is a schematic cross-sectional view showing a device stack according to some exemplary embodiments of the present disclosure.

FIG. 6 illustrates a device stack 600 according to some embodiments of the present disclosure. In some embodiments, the device stack 600 includes a semiconductor device 610 stacked over another semiconductor device 610'. Each of the semiconductor device 610 and the semiconductor device 610' may be manufactured according to the method as illustrated in the aforementioned embodiments. For example, each of the semiconductor devices 610 and 610' may be the semiconductor device 100, 200, 300, 400, or 500 as illustrated in FIG. 1K, 2B, 3B, 4B, or 5A. In an embodiment, the semiconductor device 610 and the semiconductor device 610' have the same integrated circuit design. In other embodiments, the semiconductor device 610 and the semiconductor device 610' have different integrated circuit designs. For example, the semiconductor device 610 and the semiconductor device 610' may include an application processor (AP), central processing units, microcontrollers, radiofrequency units, sensors, micro-electro-mechanical system (MEMS), power management units, signal processing units (e.g., digital signal processing (DSP) units), analog units, or the like.

In some embodiments, the semiconductor device 610 and 610' are bonded in a hybrid bonding configuration. The semiconductor device 610 and 610' are disposed face down such that the front side of the semiconductor device 610 can face the back side of the semiconductor device 610'. In the hybrid bonding configuration, the oxide layer 190 of the semiconductor device 610 is bonded to the insulating layer 180 of the semiconductor device 610' through oxide-oxide bonding, and the conductive via 154 of the semiconductor device 610 is bonded to the bonding pad 182 of the semiconductor device 510' through metal-metal bonding. The hybrid bonding configuration can be formed by aligning the semiconductor device 610 and the semiconductor device 610' and heating the devices 610 and 610' to a temperature of about 150° C. to 350° C. for a duration between about 0.5 hours to 4 hours. In some embodiments, the metal atoms of the conductive via 154 and the bonding pad 182 inter-diffuse to each other to form the metal-metal bonding of the semiconductor device 610 and 610', and electrical connection is provided by the physical connection of the bonding pad 182 to the conductive via 154.

In some embodiments, semiconductor devices 610 and 610' can further stack over and be electrically connected (through hybrid bonding or some other technique) to another semiconductor device 610". The semiconductor device 610" may be the same as the semiconductor device 610 or 610". In other embodiments, the semiconductor device 610" can be one of the semiconductor devices 100, 200, 300, 400, or 500. Connectors 614 may be formed over the active side of the semiconductor device 610" to connect the device stack 600 to a substrate or another package. In some embodiments, the connector 614 may be ball grid array (BGA) connectors, lead-free solder balls, controlled collapse connection (C4) bumps, electroless nickel electroless palladium immersion gold (ENEPIG) formed bumps, or the like. The connectors 614 may include a conductive material such as solder, gold, nickel, silver, palladium, tin, the like, or a combination thereof. In some embodiments, a UBM (under bump metal) 612 is formed between the bonding pad 182 and the connector 614. The UBM 614 can provide better adhesive and stress buffer for the connector 614. The UBM 614 may include a material formed of copper, titanium, tungsten, aluminum, or the like.

Figure 7:
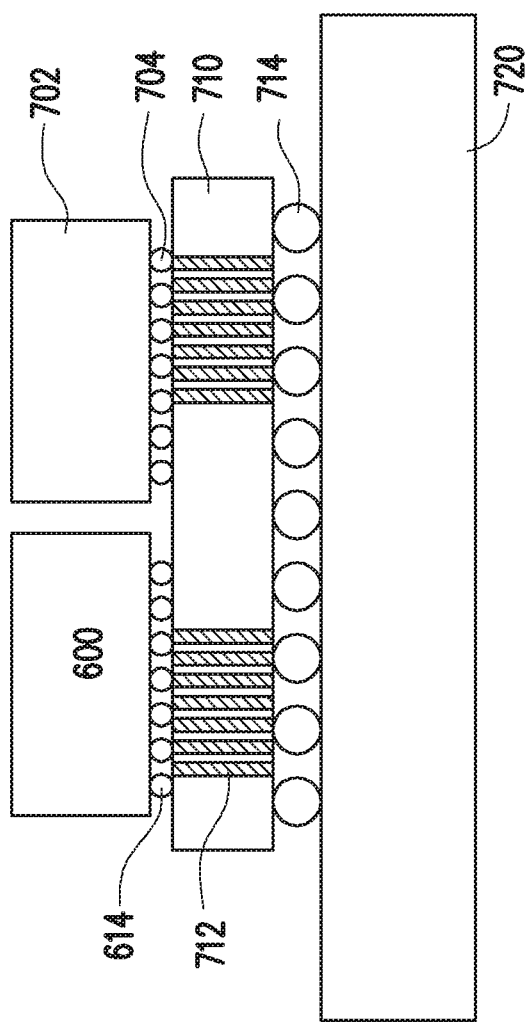
FIG. 7 is an application of a semiconductor device according to some exemplary embodiments of the present disclosure.

FIG. 7 illustrates a multi-chip package 700 according to some embodiments of the present disclosure. The multi-chip package 700 may include the device stack 600 and a memory stack 702. The device stack 600 and the memory stack 702 are horizontally arranged on an interposer 710 and connect to an interposer 710 through connectors 614 and 704. The memory stack 702 may include a plurality of memory chips such as dynamic random-access memory (DRAM) chips, static random-access memory (SRAM) chips, resistive random-access dies (RRAM) chips, magnetoresistive random-access memory (MRAM) chips, or the like. The interposer 710 may be with or without active circuits formed in or on. The interposer 710 includes through conductive vias 712 to electrically connect the device stack 600 and the memory stack 700 to the substrate 720 through connectors 714. In some embodiments, the substrate 720 is a printed circuit board. The connectors 614, 704 and 714 may be ball grid array (BGA) connectors, lead-free solder balls, controlled collapse connection (C4) bumps, electroless nickel electroless palladium immersion gold (ENEPIG) formed bumps, or the like. The connector 614, 704, and 714 may include a conductive material such as solder, gold, nickel, silver, palladium, tin, the like, or a combination thereof.

Figure 8:
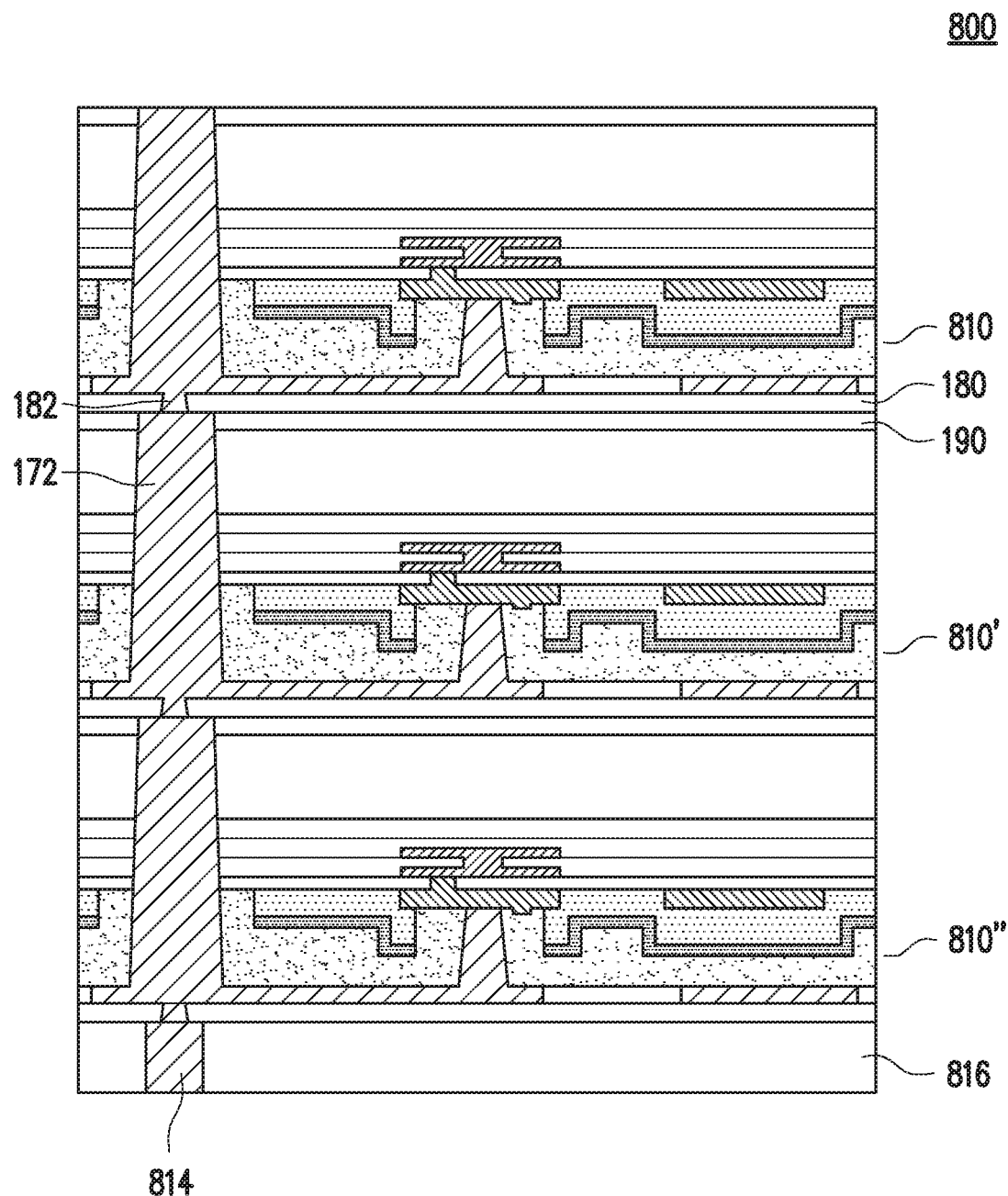
FIG. 8 is a schematic cross-sectional view showing a device stack according to some exemplary embodiments of the present disclosure.

FIG. 8 illustrates a device stack 800 that includes multiple semiconductor devices according to some embodiments of the present disclosure. In some embodiments, the device stack 800 includes a semiconductor device 810 stacked over another semiconductor device 810', which in turn is stacked over semiconductor device 810". Each or at least one of the semiconductor devices of FIG. 8 may be manufactured according to the method as illustrated in the aforementioned embodiments. For example, each or at least one of the semiconductor devices may be the semiconductor device 100, 200, 300, 400, or 500 as illustrated in FIG. 1K, 2B, 3B, 4B, or 5A. In an embodiment, the semiconductor devices have the same integrated circuit design. In other embodiments, the semiconductor devices have different integrated circuit designs. For example, each or at least one of the semiconductor devices in FIG. 8 may include an application processor (AP), central processing units, microcontrollers, radiofrequency units, sensors, micro-electro-mechanical system (MEMS), power management units, signal processing units (e.g., digital signal processing, (DSP) units), analog units, or the like.

In some embodiments, connectors 814 are metal pillars (e.g., Cu pillars) formed over the bonding pad 182. The metal pillars may be formed by electroplating. A polymer layer 816 is then deposited over the insulating layer 180 and surrounds the connector 814. In some embodiments, the polymer layer 816 includes polybenzoxazole (PBO), polyimide (PI), benzocyclobutene (BCB), or the like.

Figure 9:
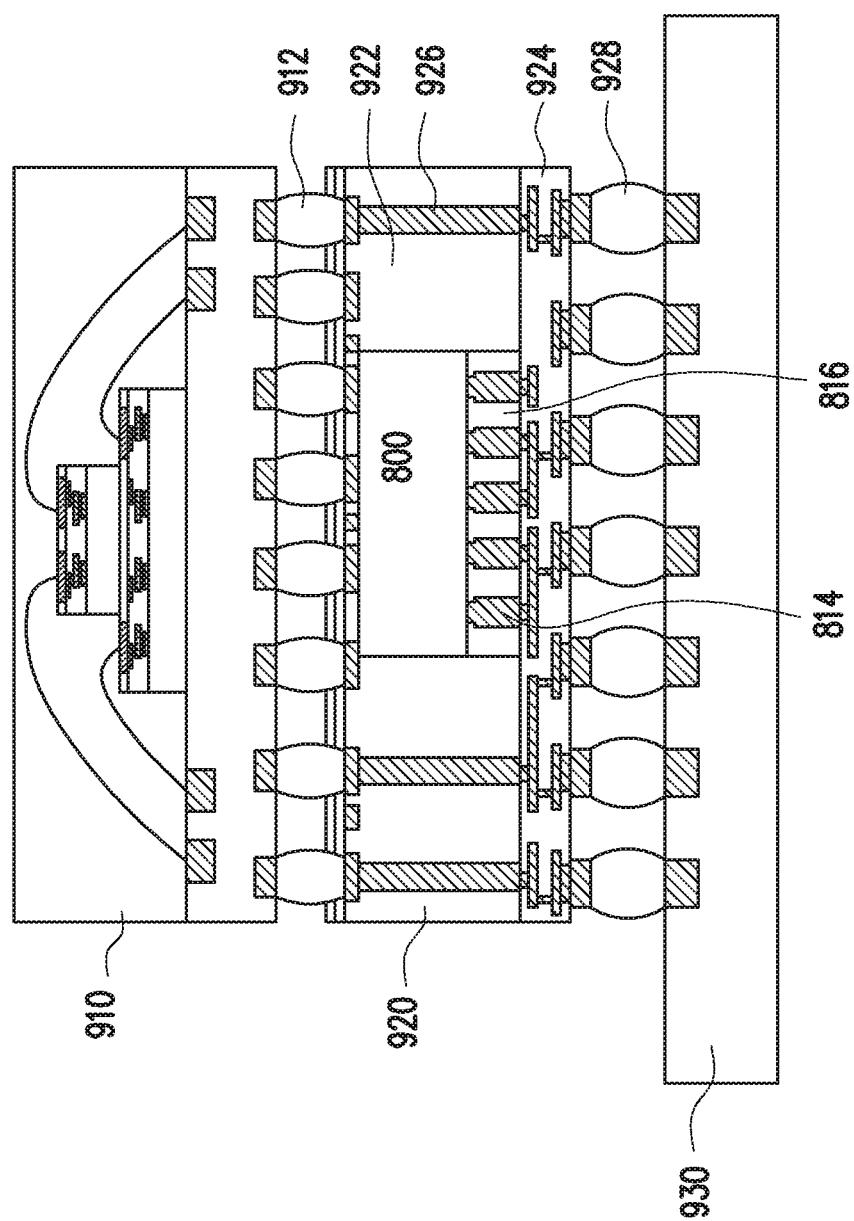
FIG. 9 is an application of a semiconductor device according to some exemplary embodiments of the present disclosure.

FIG. 9 illustrates a fan-out multi-chip package 900 according to some embodiments of the present disclosure. The fan-out multi-chip package 900 may include an upper package 910 that includes a memory stack and a lower package 920 that includes the device stack 800. The memory stack of the upper package 910 may include a plurality of memory chips. The memory stack may include a plurality of memory chips such as dynamic random-access memory (DRAM) chips, static random-access memory (SRAM) chips, resistive random-access dies (RRAM) chips, magnetoresistive random-access memory (MRAM) chips, or the like.

The lower package 920 includes the device stack 800 that is enclosed by an encapsulating layer 922 (e.g., a molding compound). The lower package 920 includes a plurality of through insulating vias 926 disposed around the device stack 800 and penetrating through the encapsulating material 922. The lower package 920 includes a fan-out redistribution layer 924 disposed over the device stack 800 and the encapsulating material 922. The device stack 800 connects to the fan-out redistribution layer 924 through the connectors 814. In some embodiments, the lower package 920 is formed by forming the plurality of through insulating vias 926 over a carrier substrate; disposing the device stack 800 over the carrier substrate, its connectors 814 facing a side away from the carrier substrate; filling the encapsulating layer 922 to the space among the device stack 800 and through insulating vias 926; grinding the connector 814, through insulating vias 926 and the encapsulating layer 922 to create a flat surface; forming the fan-out redistribution layer 924 on the surface. In some embodiments, the carrier substrate is a glass wafer or a glass panel.

The upper package 910 is disposed on the lower package 920 through connectors 912. Thus, the device stack 800 is electrically connected to the upper package through the connector 604, the redistribution layer 924, the through insulating vias 926, and the connectors 912. In some embodiments, the package stack of the upper package 910 and the lower package 920 is disposed over a substrate (e.g., printed circuit board) through connectors 928. The connectors 912 and 924 may include ball grid array (BGA) connectors, lead-free solder balls, controlled collapse connection (C4) bumps, electroless nickel electroless palladium immersion gold (ENEPIG) formed bumps, or the like. The connector 912 and 928 may include a conductive material such as solder, gold, nickel, silver, palladium, tin, the like, or a combination thereof.

It should be noted that the packaged device illustrated in FIG. 9 is not limited to the device stack 800, but in other embodiments, device stack 600 could be used within lower package 920. Likewise, the package illustrated in FIG. 7 is not limited to device stack 600 and it is contemplated that device stack 800 could be employed therein.

In accordance with some embodiments of the present disclosure, a method of manufacturing a semiconductor device is provided. The method includes providing a semiconductor substrate; forming a conductive pad over the semiconductor substrate; forming a passivation layer over the conductive pad; forming a first opening and a second opening in the passivation layer, wherein the second opening exposes the conductive pad, and wherein the first opening is spaced apart from the conductive pad and expose an upper surface of a layer that extends underneath the conductive pad; forming a first conductive via in the first opening, wherein the first conductive via extends into the semiconductor substrate; and forming a second conductive via in the second opening, wherein the second conductive via connects to the conductive pad.

In accordance with alternative embodiments, a method of manufacturing a semiconductor device is provided. The method includes providing a substrate having a circuit formed thereon, wherein the substrate has a first region and a second region; forming a first passivation layer over the circuit; forming a conductive pad over the first passivation layer, wherein the conductive pad is electrically connected to the circuit; forming a second passivation layer over the conductive pad and the first passivation layer, wherein the second passivation layer has a first opening in the first region and a second opening in the second region, wherein the first opening exposes an upper surface of a layer that extends underneath the conductive pad, and the second opening exposes the conductive pad; forming a first insulating layer over the second passivation layer, wherein the first insulating layer fills the first opening and the second opening; forming a first conductive via in the first region, wherein the first conductive via has at least a portion in the first opening and extends from the first insulating layer into the semiconductor substrate; and forming a second conductive via in the second region, wherein the second via has at least a portion in the second opening and connects to the conductive pad.

In accordance with yet alternative embodiments, a semiconductor device is provided. The semiconductor device includes a substrate having a circuit formed thereon; a first passivation layer over the circuit; a conductive pad over the first passivation layer and electrically connecting to the circuit; a second passivation layer over the conductive pad and the first passivation layer, wherein the second passivation layer has a first opening and a second opening, the first opening exposing an upper surface of a layer that extends underneath the conductive pad, the second opening exposing the conductive pad; a first insulating layer disposed over the second passivation layer and filling the first opening and the second opening; a through substrate via at least partially aligned with the second opening and extending through the first insulating layer, the second passivation layer, the first passivation layer and the substrate, wherein a side of through substrate via and the second passivation layer have a gap that is filled with the first insulating layer; and a conductive via extending through the first insulating layer and connecting to the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    providing a semiconductor substrate;
    forming a conductive pad over the semiconductor substrate;
    forming a passivation layer over the conductive pad;
    forming a first opening in the passivation layer and forming a second opening in the passivation layer, wherein the second opening exposes the conductive pad, and wherein the first opening is spaced apart from the second opening and from the conductive pad and further wherein the first opening exposes an upper surface of a layer that extends underneath the conductive pad;
    forming a first conductive via in the first opening, wherein the first conductive via extends into the semiconductor substrate; and
    forming a second conductive via in the second opening, wherein the second conductive via connects to the conductive pad.

2. The method of claim 1, wherein the passivation layer has an upper surface conformal to the profile of the conductive pad.

3. The method of claim 2, further comprising:
    depositing a first insulating layer over the passivation layer and filling the first opening and the second opening; and
    planarizing the first insulating layer.

4. The method of claim 3, wherein the step of forming the first conductive via comprises:
    etching the planarized first insulating layer, the layer and the semiconductor substrate to form a first via hole, wherein the first via hole is at least partially aligned with the first opening; and
    filling the first via hole with a conductive material.

5. The method of claim 4, further comprising:
    forming a second insulating layer over the planarized first insulating layer and the first conductive via;
    forming a line trench in the second insulating layer, wherein the line trench has at least a portion exposing the first conductive via;
    forming a second via hole exposing the conductive pad, wherein the second via hole is at least partially aligned with the line trench; and
    filling the conductive material in the line trench and the second via hole.

6. The method of claim 3, wherein the step of forming the second conductive via comprises:
    etching the planarized first insulating layer to form a second via hole, wherein the second via hole is at least partially aligned with the second opening and exposes the conductive pad; and
    filling a conductive material in the second via hole.

7. The method of claim 3, further comprising forming an interconnection structure over the semiconductor substrate, wherein the layer that extends underneath the conductive pad is a layer disposed between the passivation layer and the interconnection structure or a layer disposed in the interconnection structure.

8. The method of claim 7, wherein the interconnection structure has a landing pad spaced apart from the first conductive via and the conductive pad, and the method further comprises forming a third conductive via that extends through the first insulating layer and connects to the landing pad of the interconnection structure.

9. The method claim of claim 1, wherein the conductive pad has a probe mark, and the second conductive via is laterally spaced apart from the probe mark.

10. The method of claim 1, further comprising:
    grinding the semiconductor substrate from a back surface of the semiconductor substrate for revealing the first conductive via; and
    forming an oxide layer over the back surface of the semiconductor substrate.

11. A method of manufacturing a semiconductor structure, comprising:
    providing a substrate having a circuit formed thereon, wherein the substrate has a first region and a second region;
    forming a first passivation layer over the circuit;
    forming a conductive pad over the first passivation layer, wherein the conductive pad is electrically connected to the circuit;
    forming a second passivation layer over the conductive pad and the first passivation layer, wherein the second passivation layer has a first opening in the first region and a second opening in the second region, wherein the first opening exposes an upper surface of a layer that extends underneath the conductive pad, and the second opening exposes the conductive pad;
    forming a first insulating layer over the second passivation layer, wherein the first insulating layer fills the first opening and the second opening;
    forming a first conductive via in the first region, wherein the first conductive via has at least a portion in the first opening and extends from the first insulating layer into the semiconductor substrate; and
    forming a second conductive via in the second region, wherein the second via has at least a portion in the second opening and connects to the conductive pad.

12. The method of claim 11, further comprising after forming the first conductive via, forming a second insulating layer over the first insulating layer and the first conductive via, wherein the second insulating layer has a line trench exposing at least a part of the first conductive via.

13. The method of claim 12, wherein the step of forming the second conductive via comprises:
    etching the first insulating layer to form a via hole that is partially aligned with the line trench of the second insulating layer and exposes the conductive pad; and
    filling a conductive material in the via hole and the line trench.

14. The method of claim 13, further comprising forming an interconnection structure over the substrate before forming the first passivation layer, wherein the interconnection structure has a landing pad within a third region that is spaced apart from the first region and the second region, wherein the layer extends underneath the conductive pad is the first passivation layer or an insulating layer in the interconnection structure.

15. The method of claim 14, wherein the conductive pad is essentially formed of aluminum or its alloys, and the landing pad is essentially formed of copper or its alloys.

16. The method of claim 11, wherein the first passivation layer comprises silicon nitride, silicon oxynitride, silicon carbon nitride, a polymer, or a combination thereof.

17. The method of claim 11, wherein the second passivation layer comprises one or more sub-layers, and at least one of the one or more sub-layers comprises silicon oxide, boron-doped silicon glass, or phosphorus-doped silicon glass or a combination thereof.

18. A semiconductor device, comprising:
a substrate having a circuit formed thereon;
a first passivation layer over the circuit;
a conductive pad over the first passivation layer and electrically connecting to the circuit;
a second passivation layer over the conductive pad and the first passivation layer, wherein the second passivation layer has a first opening and a second opening laterally displaced from the first opening, the first opening exposing an upper surface of a layer that extends underneath the conductive pad, the second opening exposing the conductive pad;
a first insulating layer disposed over the second passivation layer and filling the first opening and the second opening;
a through substrate via at least partially aligned with the second opening and extending through the first insulating layer, the second passivation layer, the first passivation layer and the substrate, wherein a side of the through substrate via and the second passivation layer have a gap that is filled with the first insulating layer; and
a conductive via extending through the first insulating layer and connecting to the conductive pad.

19. The semiconductor device of claim 18, further comprising an interconnection structure disposed between the substrate and the first passivation layer, wherein the layer that extends underneath the conductive pad is the first passivation layer or an insulating layer disposed in the interconnection structure.

20. The semiconductor device of claim 18, further comprising a bonding pad disposed over the through substrate via, wherein the conductive pad is essentially formed of aluminum or its alloys, and the bonding pad is essentially formed of copper or its alloys.

* * * * *

UNITED STATES PATENT AND TRADEMARK OFFICE
CERTIFICATE OF CORRECTION

| | | |
|---|---|---|
| PATENT NO. | : 11,621,214 B2 | |
| APPLICATION NO. | : 17/086033 | |
| DATED | : April 4, 2023 | |
| INVENTOR(S) | : Hsien-Wei Chen | |

It is certified that error appears in the above-identified patent and that said Letters Patent is hereby corrected as shown below:

In the Claims

Claim 9, Column 14, Line 1; delete "method claim of claim" and insert --method of claim--.

Signed and Sealed this
Twenty-ninth Day of August, 2023

Katherine Kelly Vidal
*Director of the United States Patent and Trademark Office*